(12) United States Patent
Yu et al.

(10) Patent No.: US 12,525,533 B2
(45) Date of Patent: Jan. 13, 2026

(54) SEMICONDUCTOR DEVICES AND METHODS OF MANUFACTURING THE SAME

(71) Applicant: Samsung Electronics Co., Ltd., Suwon-si (KR)

(72) Inventors: Jisu Yu, Seoul (KR); Youngsook Do, Seoul (KR); Eunsung Seo, Seoul (KR); Wooseok Kim, Suwon-si (KR); Wonsik Yu, Anyang-si (KR); Chanyoung Jeong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 679 days.

(21) Appl. No.: 17/731,464

(22) Filed: Apr. 28, 2022

(65) Prior Publication Data

US 2023/0086367 A1 Mar. 23, 2023

(30) Foreign Application Priority Data

Sep. 17, 2021 (KR) .......................... 10-2021-0124792

(51) Int. Cl.
*H01L 23/528* (2006.01)
*H01L 23/522* (2006.01)

(52) U.S. Cl.
CPC ...... *H01L 23/5286* (2013.01); *H01L 23/5223* (2013.01)

(58) Field of Classification Search
None
See application file for complete search history.

(56) References Cited

U.S. PATENT DOCUMENTS

| | | |
|---|---|---|
| 6,570,210 B1 | 5/2003 | Sowlati et al. |
| 7,518,850 B2 | 4/2009 | Kim et al. |
| 7,816,197 B2 | 10/2010 | Kim et al. |
| 7,838,384 B2 | 11/2010 | Cho et al. |
| 8,536,016 B2 | 9/2013 | Chew et al. |
| 8,749,022 B2 | 6/2014 | Chang et al. |
| 8,980,708 B2 | 3/2015 | Zhu et al. |
| 9,520,506 B2 | 12/2016 | Luo et al. |
| 10,522,456 B2 | 12/2019 | Kim et al. |
| 2009/0213522 A1 | 8/2009 | Kim et al. |
| 2015/0022948 A1 | 1/2015 | An et al. |
| 2017/0271317 A1* | 9/2017 | Gotou ............... G06F 30/392 |

(Continued)

FOREIGN PATENT DOCUMENTS

KR 20150010353 A 1/2015

*Primary Examiner* — Benjamin P Sandvik
(74) *Attorney, Agent, or Firm* — Wolf, Greenfield & Sacks, P.C.

(57) ABSTRACT

A semiconductor device includes: a standard cell array including a plurality of standard cells, each of the plurality of standard cells; a plurality of power supply lines configured to provide a power supply voltage and extending in a first direction; a capacitor structure including electrode structures included in each of a plurality of dielectric layers formed on the standard cell array, the capacitor structure having vias connecting the electrode structures; and contacts electrically connecting the capacitor structure and the standard cell array to each other. Each of the plurality of standard cells provides a unit capacitor circuit having capacitance that is based on a connection structure of active regions and gates of first and second transistors thereof.

17 Claims, 28 Drawing Sheets

(56) References Cited

U.S. PATENT DOCUMENTS

| | | |
|---|---|---|
| 2018/0226336 A1* | 8/2018 | Kim .................... H01L 27/0207 |
| 2019/0198530 A1* | 6/2019 | Hino ................... H01L 27/0629 |
| 2019/0267366 A1* | 8/2019 | Do ........................ H10D 84/85 |
| 2020/0393503 A1* | 12/2020 | Cliquennois ............ H01L 28/40 |
| 2021/0272904 A1* | 9/2021 | Komuro .............. H01L 23/5286 |
| 2021/0305151 A1* | 9/2021 | Sakai .................. H01L 23/5286 |
| 2021/0335774 A1* | 10/2021 | Ochiai ................ H01L 23/5286 |

\* cited by examiner

SEMICONDUCTOR DEVICES AND METHODS OF MANUFACTURING THE SAME

CROSS-REFERENCE TO RELATED APPLICATION(S)

This application claims benefit of priority to Korean Patent Application No. 10-2021-0124792 filed on Sep. 17, 2021, in the Korean Intellectual Property Office, and the entire contents of the above-identified application are incorporated by reference herein.

TECHNICAL FIELD

The present disclosure relates to semiconductor devices and to methods of manufacturing the same.

BACKGROUND

A semiconductor device may include semiconductor devices formed on a semiconductor substrate, interconnections for connecting the semiconductor devices to each other, and the like, and may be designed by arranging predefined standard cells in a library and connecting the arranged standard cells to each other. As an integration density of semiconductor devices increases, various methods of efficiently arranging interconnections for connecting the semiconductor devices to each other have been proposed.

SUMMARY

Aspects of the present disclosure may provide semiconductor devices, in which one or more standard cells are arranged below a capacitor structure formed in a back end of line (BEOL) process, such that additional capacitance is provided to supplement capacitance of the capacitor structure, and methods of manufacturing the semiconductor devices.

According to an example embodiment, a semiconductor device may include: a standard cell array including a plurality of standard cells; a plurality of power supply lines configured to provide a power supply voltage and extending in a first direction; a capacitor structure including electrode structures included in each of a plurality of dielectric layers formed on the standard cell array, and a capacitor structure having vias connecting the electrode structures; and contacts electrically connecting the capacitor structure and the standard cell array to each other. Each of the plurality of standard cells may include a first transistor connected to a first power supply line of the plurality of power supply lines, and a second transistor connected to a second power supply line of the plurality of power supply lines, and provides a unit capacitor circuit having capacitance that is based on a connection structure of active regions and gates of the first and second transistors.

According to some example embodiments, a semiconductor device may include: a standard cell array including a plurality of standard cells; a plurality of power supply lines configured to provide a power supply voltage and extending in a first direction; a capacitor structure including electrode structures included in each of a plurality of dielectric layers formed on the standard cell array and vias connecting the electrode structures to each other; and contacts electrically connecting the capacitor structure and the standard cell array to each other. Each of the plurality of standard cells may include a first transistor and a second transistor including impurities having different conductivity types, and active regions and gates of the first and second transistors may be connected to a first power supply line of the plurality of power supply lines.

According to some example embodiments, a semiconductor device may include: a standard cell array including a plurality of standard cells; a plurality of power supply lines configured to provide a power supply voltage and extending in a first direction; and a capacitor structure including electrode structures included in each of a plurality of dielectric layers formed on the standard cell array and vias connecting the electrode structures to each other. Each of the plurality of standard cells may be connected to the capacitor structure in parallel to provide a unit capacitor circuit.

According to an example embodiment, a manufacturing method of a semiconductor device including a standard cell array includes: arranging a plurality of standard cells in the standard cell array with reference to a standard cell library, each of the plurality of standard cells providing a unit capacitor circuit; generating mask data based on the generated layout data; performing a front end of line (FEOL) process using the mask data to form the standard cell array; and performing a back end of line (BEOL) process using the mask data to form a capacitor structure connected to the standard cell array on the standard cell array and including electrode structures included in each of a plurality of dielectric layers, and including vias connecting the electrode structures to each other.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, some example embodiments will be described with reference to the accompanying drawings.

Figure 1:
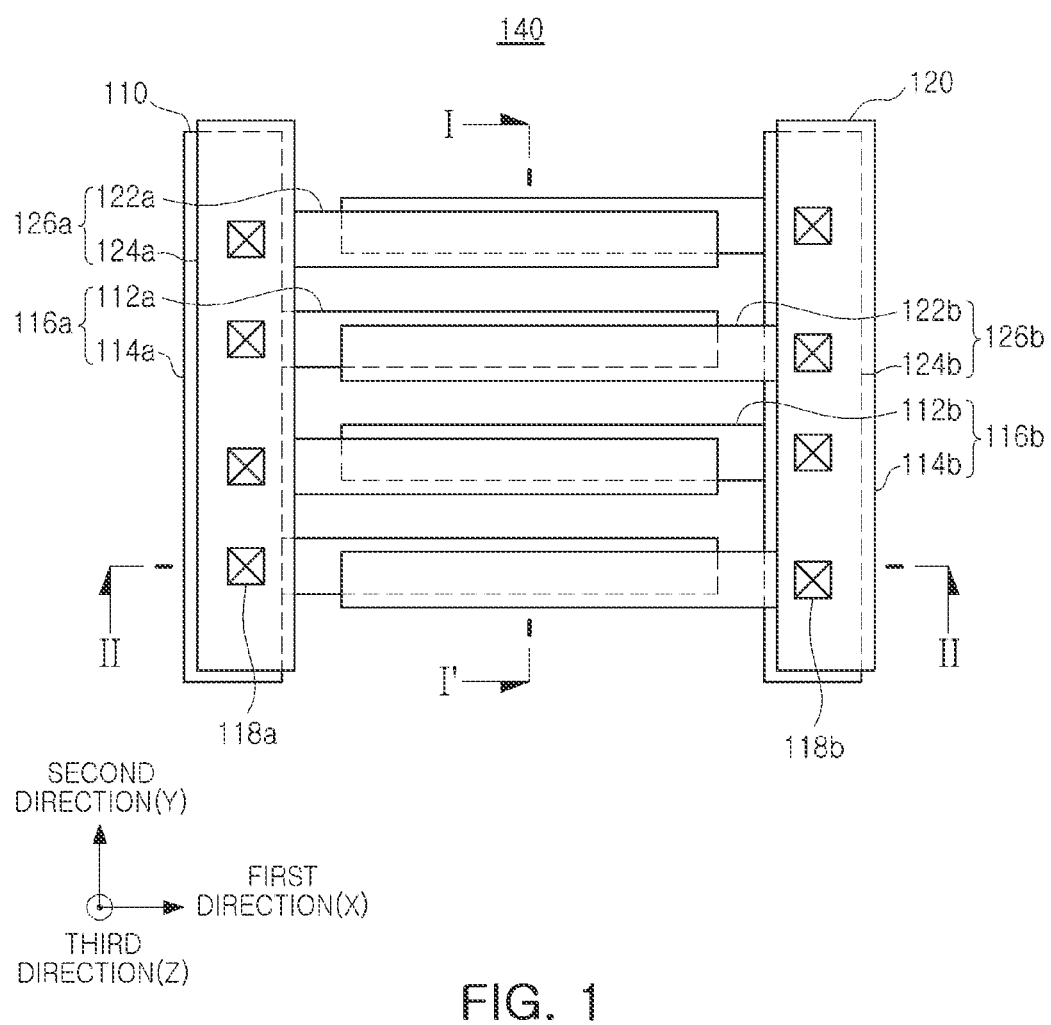
FIG. 1 is a plan view illustrating a capacitor structure included in a semiconductor device according to some example embodiments.
Figure 2A:
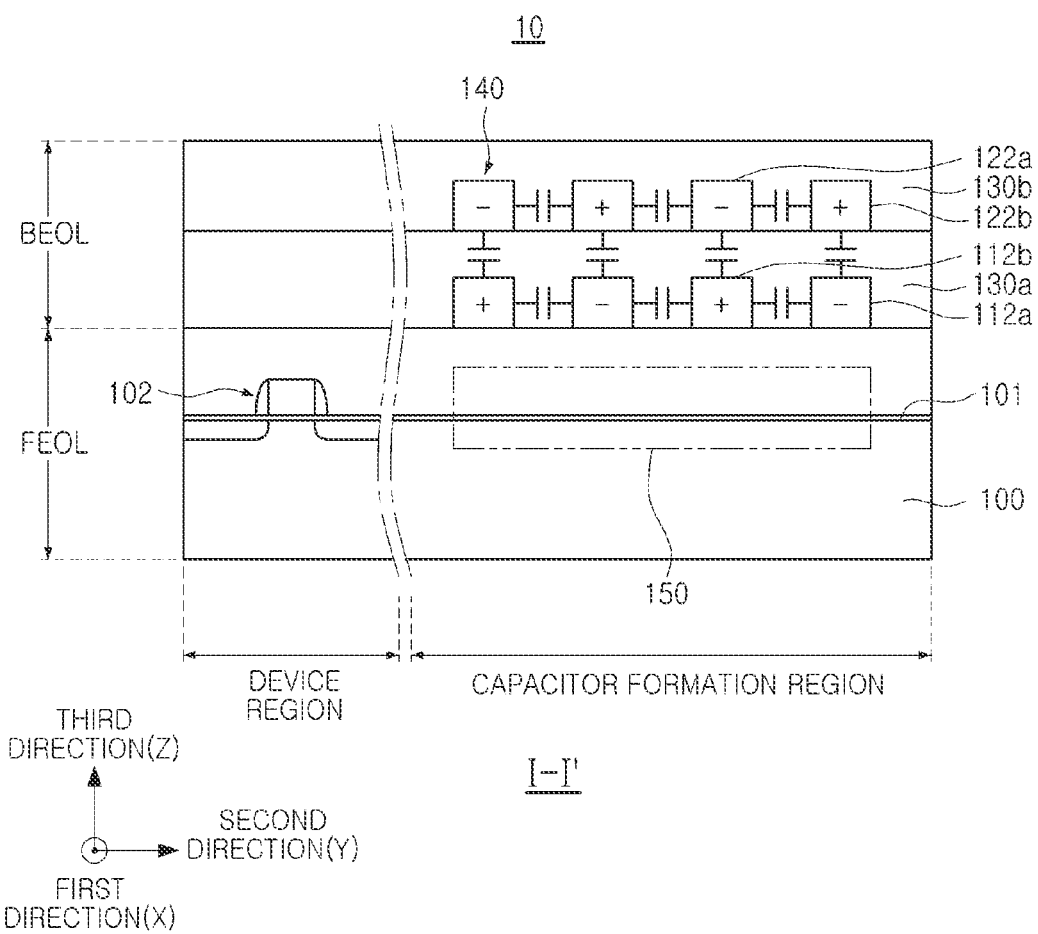
FIGS. 2A and 2B are cross-sectional views of a semiconductor device including the capacitor structure illustrated in FIG. 1.
Figure 2B:
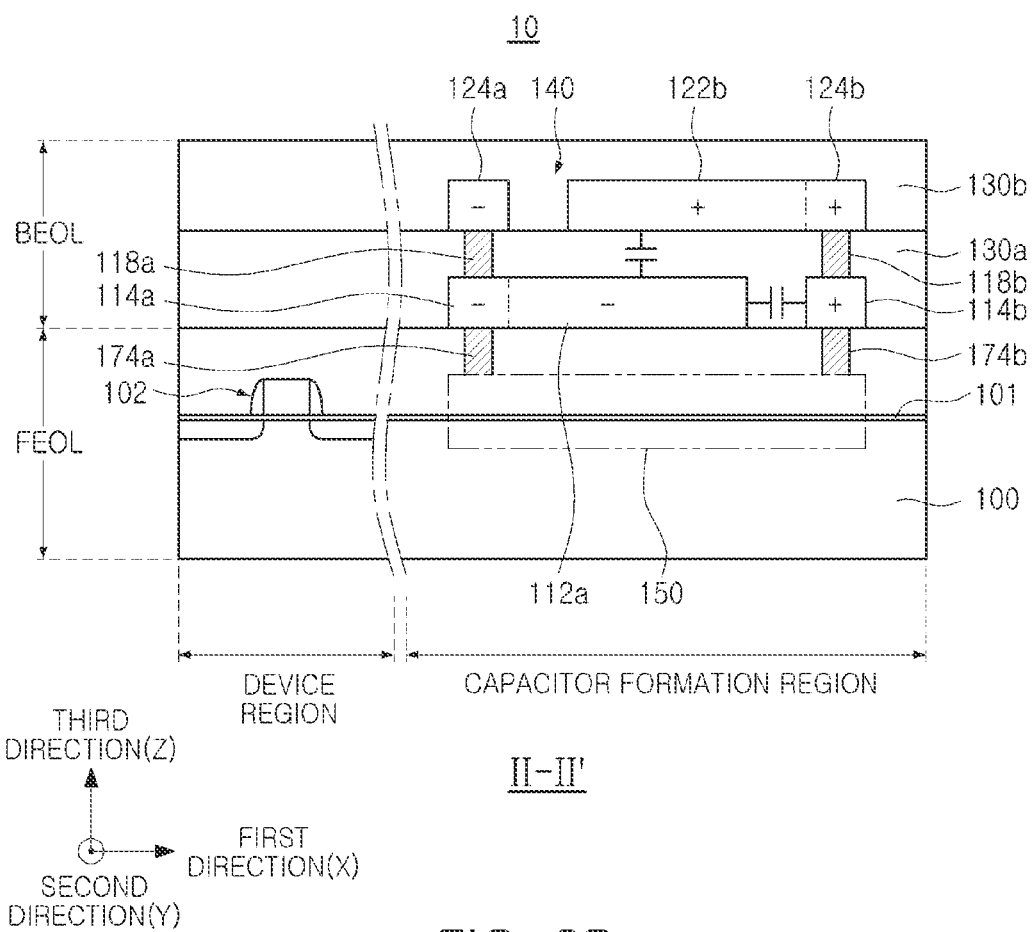

FIG. 1 is a plan view illustrating a capacitor structure included in a semiconductor device according to an example embodiment. FIGS. 2A and 2B are cross-sectional views of a semiconductor device including the capacitor structure illustrated in FIG. 1.

Referring to FIG. 1, a capacitor structure 140 may include electrode structures 110 and 120 including a plurality of layers, and vias 118a and 118b. The vias 118a and 118b may electrically connect the electrode structures 110 and 120 to each other. FIG. 1 illustrates a case in which the capacitor structure 140 includes two layers, the electrode structures 110 and 120, but the number of stacked layers of the electrode structures is not limited thereto.

For ease of description in FIG. 1, the first and second electrode structures 110 and 120 are illustrated to be slightly shifted. However, the first and second electrode structures 110 and 120 may be overlapping in a third or vertical direction Z.

The first electrode structure 110 may include first conductive patterns 116a and 116b having opposite polarities. The first conductive pattern 116a may include first negative plates 112a and a first negative connection pattern 114a connecting the first negative plates 112a to each other. The second conductive pattern 116b may include first positive plates 112b and a first positive connection pattern 114b connecting the first positive plates 112b to each other. The first negative plates 112a and the first positive plates 112b may be alternately arranged and spaced apart from each other in a horizontal or second direction Y. Accordingly, horizontal capacitance may be formed between the first negative plates 112a and the first positive plates 112b.

The second electrode structure 120 may be spaced apart from the first electrode structure 110 in the vertical direction Z. The second electrode structure 120 may include second conductive patterns 126a and 126b having opposite polarities. The second conductive pattern 126a may include second negative plates 122a and a second negative connection pattern 124a connecting the second negative plates 122a to each other. The second conductive pattern 126b may include second positive plates 122b and a second positive connection pattern 124b connecting the second positive plates 122b to each other. The second negative plates 122a and the second positive plates 122b may be alternately arranged and spaced apart from each other in the second direction Y, and horizontal capacitance may also be formed between the second negative plates 122a and the second positive plates 122b.

The second electrode structure 120 and the first electrode structure may be arranged so as to form vertical capacitance between the second electrode structure 120 and the first electrode structure 110. For example, a portion of the second negative plates 122a may be overlap a portion of the first positive plates 112b in the vertical direction Z, and a portion of the second positive plates 122b may be overlap a portion of the first negative plates 112a in the vertical direction Z.

Referring to FIGS. 2A and 2B, a semiconductor device 10 may include the capacitor structure 140 described with reference to FIG. 1. FIG. 2A illustrates a cross-section taken in direction I-I' of the capacitor structure 140, and FIG. 2B illustrates a cross-section taken in direction II-II' of the capacitor structure 140.

Referring to FIGS. 2A and 2B, the semiconductor device 10 may include a substrate 100 in which a device region and a capacitor formation region are separated from each other. Lower devices 102, formed by a front end of line (FEOL) process, may be provided in the device region of the substrate 100. The lower devices 102 may include a metal-oxide-semiconductor (MOS) transistor, a diode, and lower interconnections connected thereto.

A capacitor structure 140, formed in a back end of line (BEOL) process, may be provided on the capacitor formation region of the substrate 100. The substrate 100 may include a plurality of dielectric layers 130a and 130b, and the plurality of dielectric layers 130a and 130b may include the electrode structures 110 and 120 described with reference to FIG. 1. The plurality of electrode structures 110 and 120 may be connected to each other through vias 118a and 118b.

As an integration density of the semiconductor device 10 increases, it may be desirable to form a capacitor having a relatively high capacitance within a relatively limited horizontal region of the capacitor formation region. For example, when the semiconductor device 10 is an analog input/output (I/O) circuit, a capacitor having high capacitance may be used to remove noise having a radio-frequency (RF) component from an input/output signal.

A lower capacitor 150, formed by a FEOL process, may further be provided below the capacitor structure 140 to supplement the capacitance of the capacitor structure 140. Contacts 174a and 174b may be provided on the lower capacitor 150 to electrically connect the lower capacitor 150 and the capacitor structure 140 to each other. The capacitor structure 140 and the lower capacitor 150 may be connected in parallel to provide a capacitor circuit for an operation of the semiconductor device 10. For example, the lower capacitor 150 may be formed below the capacitor structure 140 to provide higher capacitance in the same horizontal area.

The lower capacitor 150 may include a MOS transistor. The MOS transistor may include a MOS structure. One side of the MOS structure may include a metal and the other side thereof may include a semiconductor, and a dielectric may be therebetween. Since the MOS structure may have a structure similar to that of a parallel plate capacitor, the MOS transistor may have a capacitance. The MOS transistor may have a characteristic in which a capacitance thereof varies depending on a voltage applied to a gate.

Processes of forming the semiconductor device 10 trend toward the scaling down and/or miniaturization of the semiconductor device 10. For example, a width of the gate structure included in the MOS transistor formed on the substrate 100 may be gradually decreased. For example, as a planar transistor is replaced with a FinFET, a width of the gate structure may be decreased. Furthermore, use of a multi-bridge channel field effect transistor (MBCFET), or the like, has resulted in a situation in which a width of the gate structure may not be increased, and/or may not be greater than a predetermined level, such that a channel region of a transistor may be formed normally.

However, the smaller a width of a gate structure included in a MOS, the lower capacitance of a MOS transistor. When the capacitance of the MOS transistor is decreased, for example due to the scaling down and/or miniaturization of the semiconductor device 10, it may be difficult for the lower capacitor 150 to provide capacitance sufficient to complement the capacitor structure 140.

According to some example embodiments, the lower capacitor 150 may include a standard cell array formed on an upper surface of the substrate 100. The standard cell array may include a plurality of standard cells arranged in a first direction and a second direction that intersects the first direction. The first and second directions may be parallel to the upper surface of the substrate 100 Each of the standard cells may include at least one gate structure and at least one active region. Standard cells, having different levels of capacitance, may be defined in a standard cell library and selected therefrom for inclusion in the plurality of standard cells included in the standard cell array.

According to some example embodiments, at least some of the plurality of standard cells included in the standard cell array may be connected to the capacitor structure 140 in parallel to supplement the capacitance of the capacitor structure 140.

Figure 3:
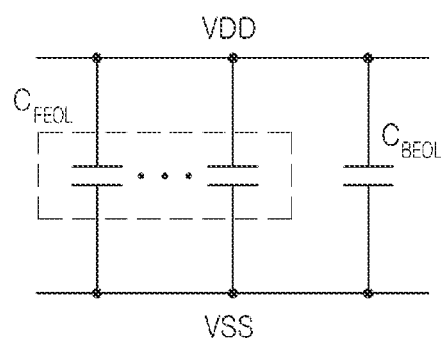
FIG. 3 is a circuit diagram illustrating an equivalent circuit in a capacitor formation region of a semiconductor device described with reference to FIGS. 2A and 2B.

FIG. 3 is a circuit diagram illustrating an equivalent circuit in a capacitor formation region of a semiconductor device described with reference to FIGS. 2A and 2B.

A plurality of standard cells, included in the standard cell array described with reference to FIGS. 2A and 2B, and the capacitor structure 140 may be connected in parallel. For example, first and second negative connection patterns 114a and 124a of the capacitor structure 140 may be connected to a second power supply voltage VSS, and first and second positive connection patterns 114b and 124b of the capacitor structure 140 may be connected to a first power supply voltage VDD. Each of the plurality of standard cells may be connected to a first power supply line configured to supply or supplying the second power supply voltage VSS, and a second power supply line configured to supply or supplying the first power voltage VDD.

In FIG. 3, the capacitance provided by a plurality of standard cells connected in parallel is illustrated as $C_{FEOL}$, and capacitance provided by the capacitor structure 140 is illustrated as $C_{BEOL}$. According to some example embodiments, the capacitor formation region of the semiconductor device 10 may provide capacitance equal to a sum of $C_{FEOL}$ and $C_{BEOL}$. Accordingly, a capacitor having a sufficient amount of capacitance may be provided even in a semiconductor device manufactured in an ultrafine process.

The capacitance $C_{FEOL}$ may have various levels depending on a combination of a plurality of standard cells included in the standard cell array. Hereinafter, various examples of standard cells according to some example embodiments will be described with reference to FIGS. 4A to 24B.

Figure 4A:
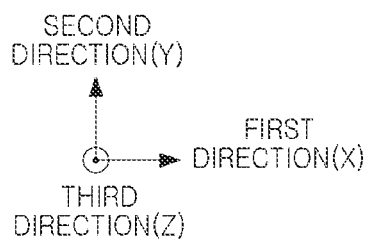
FIGS. 4A and 4B are plan views illustrating a lower capacitor according to some example embodiments.
Figure 4B:
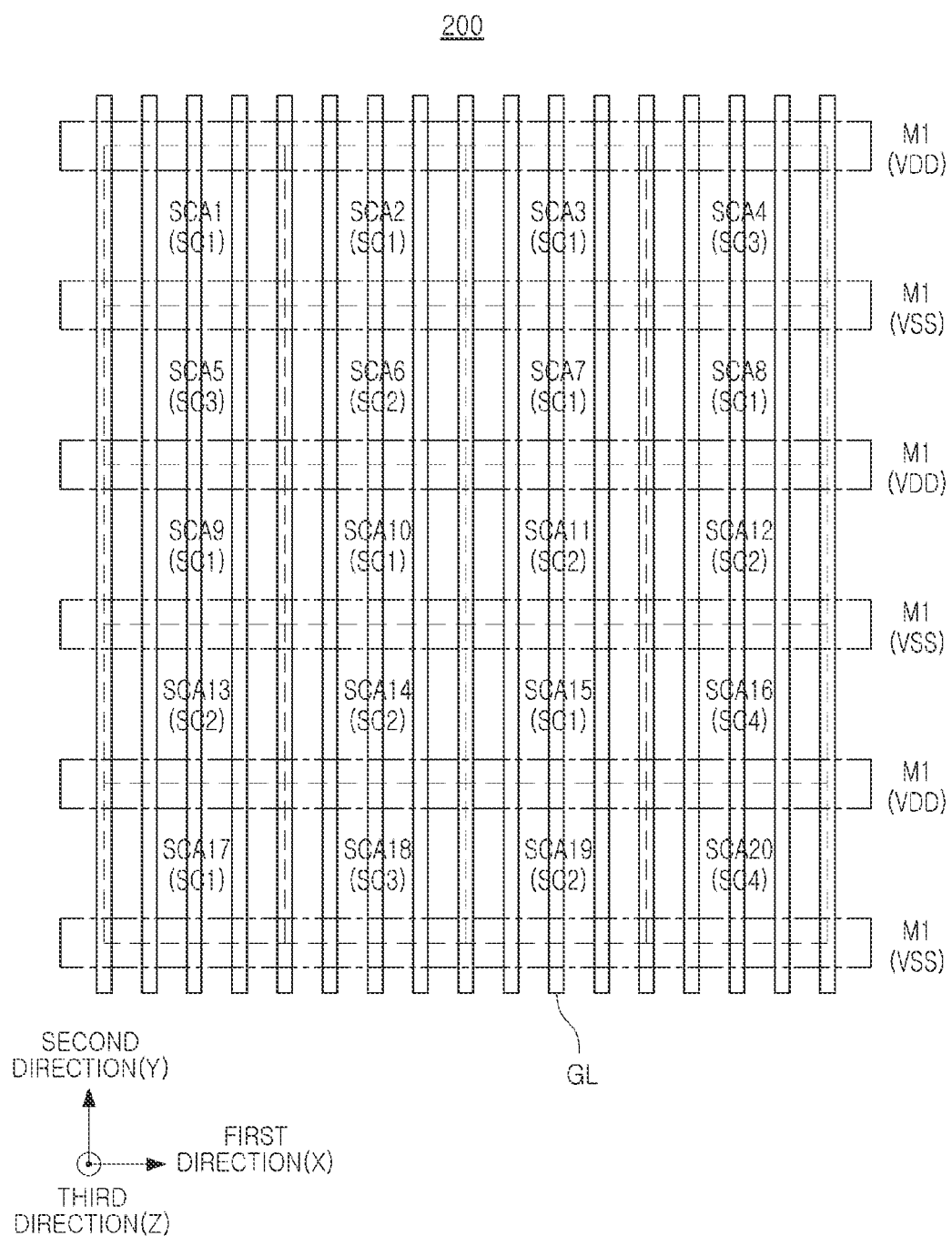

FIGS. 4A and 4B are plan views illustrating a lower capacitor according to some example embodiments.

FIG. 4A is a plan view illustrating a standard cell array according to some example embodiments, and FIG. 4B is a plan view additionally illustrating power supply lines and gate patterns in the plan view of FIG. 4A.

Referring to FIGS. 4A and 4B, a lower capacitor 200 may include a standard cell array and power supply lines. The lower capacitor 200 may correspond to the lower capacitor 150 described with reference to FIGS. 2A and 2B.

The standard cell array may include standard cell regions SCA1 to SCA20 arranged in a first direction X and a second direction Y. The standard cell regions SCA1 to SCA20 may be arranged in a matrix. The first direction X and the second direction Y may be directions parallel to an upper surface of a substrate, and the second direction Y may intersect the first direction X. Standard cells SC1 to SC4 may be arranged in the standard cell regions SCA1 to SCA20, and may provide actually operating semiconductor devices and/or circuits. In FIGS. 4A and 4B, the standard cells SC1 to SC4 are illustrated as being in the standard cell regions SCA1 to SCA20. However, the present disclosure is not limited thereto, and more various standard cells (e.g., an i-th standard cell SCI) may be arranged in more standard cell regions (e.g., a j-th standard cell region SCAJ). In addition, although omitted in FIGS. 4A and 4B, when there is space remaining after standard cells are arranged in a standard cell array, filler cells for filling the remaining space may be further provided.

The standard cell array may further include gate patterns GL. The gate patterns GL may extend in the second direction Y and may be separated from each other in the first direction X. The gate patterns GL may include gate structures providing a semiconductor device, and dummy gate structures. For example, the gate patterns GL arranged at boundaries of the standard cell regions SCA1 to SCA20 may be dummy gate structures.

The lower capacitor 200 may include power supply lines M1(VDD) and M1(VSS) extending in the first direction (X). The power supply lines M1(VDD) and M1(VSS) may be arranged and spaced apart in the second direction Y intersecting the first direction X. For example, the power supply lines M1(VDD) and M1(VSS) may extend along a boundary between the standard cell regions SCA1 to SCA20 or may cross at least one of the standard cell regions SCA1 to SCA20. The power supply lines M1(VDD) and M1(VSS) may include first power supply lines M1(VDD), transmitting or configured to transmit a first power supply voltage, and power supply lines M1(VSS) transmitting or configured to transmit a second power supply voltage, lower than the first power supply voltage. For example, the first power supply voltage may be a first power voltage VDD, and the second power supply voltage may be a second power voltage VSS. The first power supply lines M1(VDD) and the second power supply lines M1(VSS) may be alternately arranged in the second direction Y.

According to some example embodiments, each of the standard cells SC1 to SC4, provided in the standard cell regions SCA1 to SCA20, may provide a unit capacitor circuit. Each of the standard cells SC1 to SC4 may be connected in parallel to the capacitor structure 140, described with reference to FIGS. 1 to 2B, to supplement the capacitance of the capacitor structure 140. The standard cells SC1 to SC4 may be defined in a standard cell library and may have different levels of capacitance and leakage currents. Standard cells to be respectively arranged in the standard cell regions SCA1 to SCA20 may be selected depending on a capacitance value required for the operation of the semiconductor device 10.

According to some example embodiments, the standard cells SC1 to SC4 having various levels of capacitance may be combined below the capacitor structure 140, so that a standard cell array may be formed to provide a capacitor having a target capacitance. Hereinafter, some exemplary structures of the standard cells SC1 to SC4 will be described with reference to FIGS. 5 to 14B.

Figure 5:
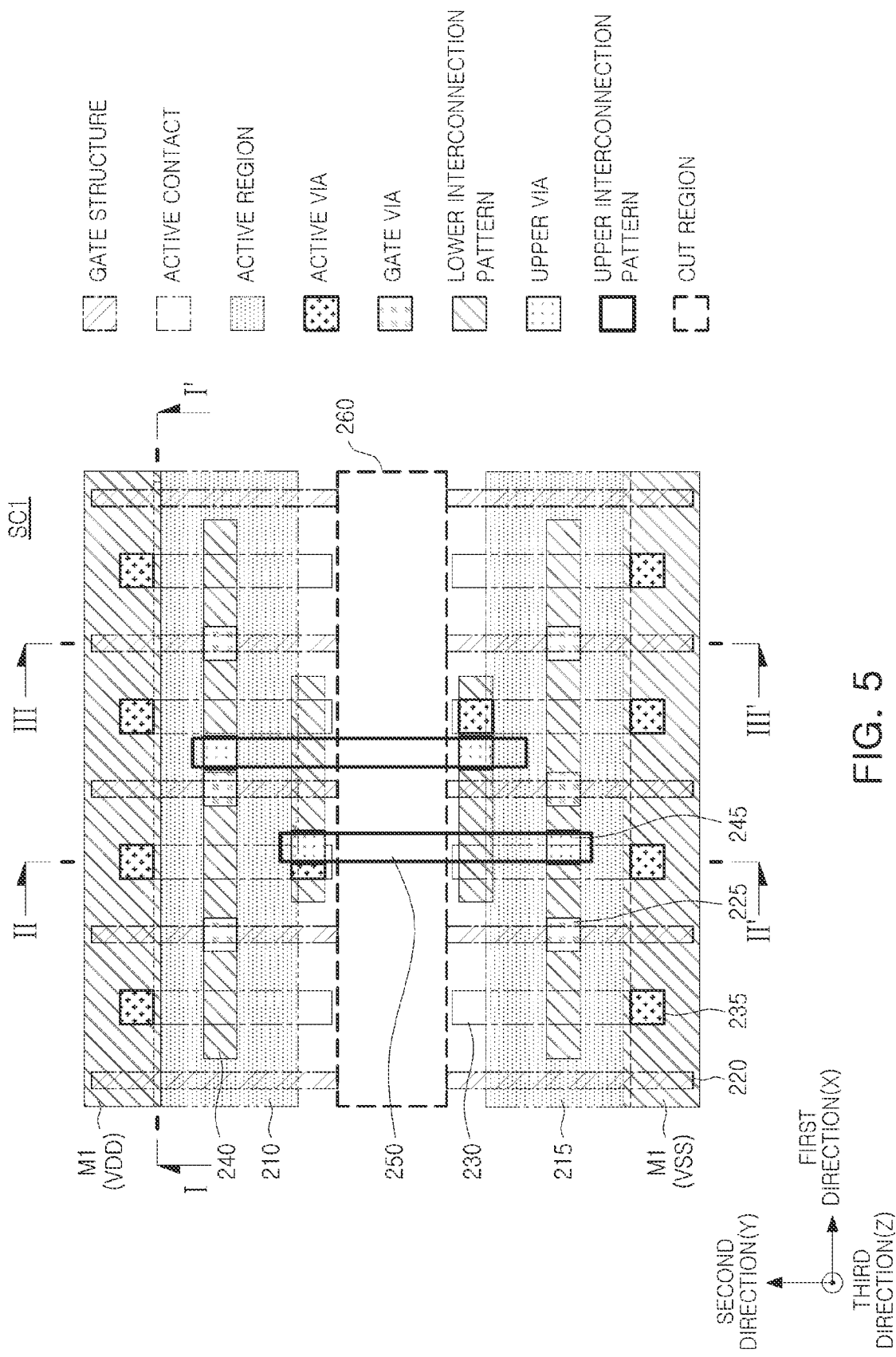
FIG. 5 is a plan view illustrating a first standard cell according to some example embodiments.
Figure 6A:
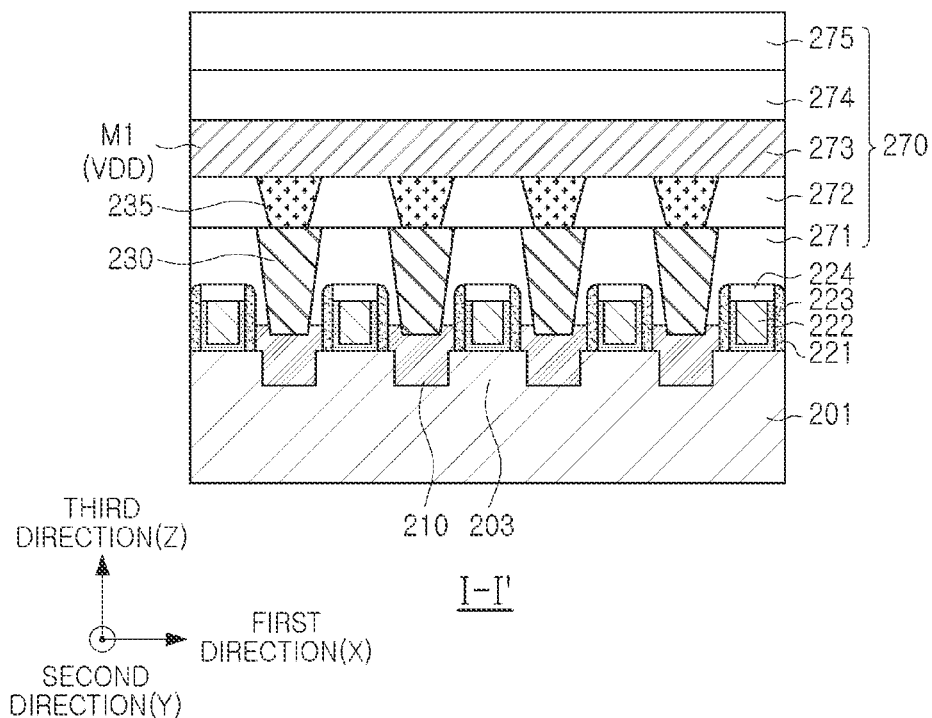
FIGS. 6A to 6C are cross-sectional views of FIG. 5.
Figure 6B:
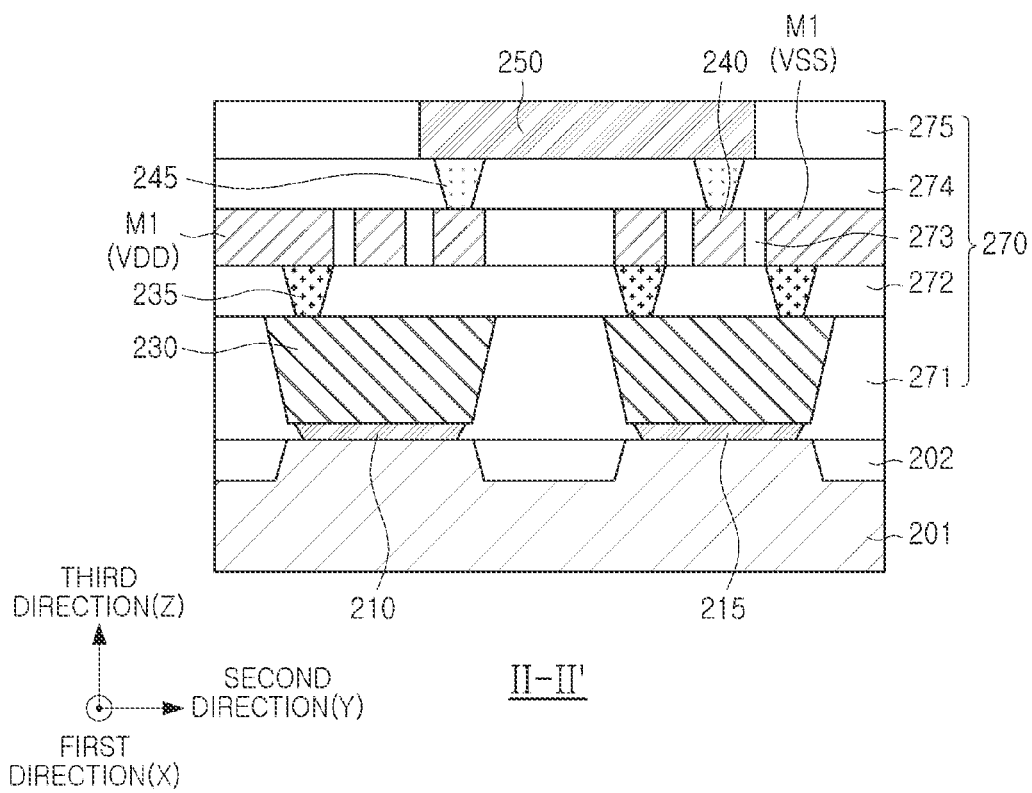
Figure 6C:
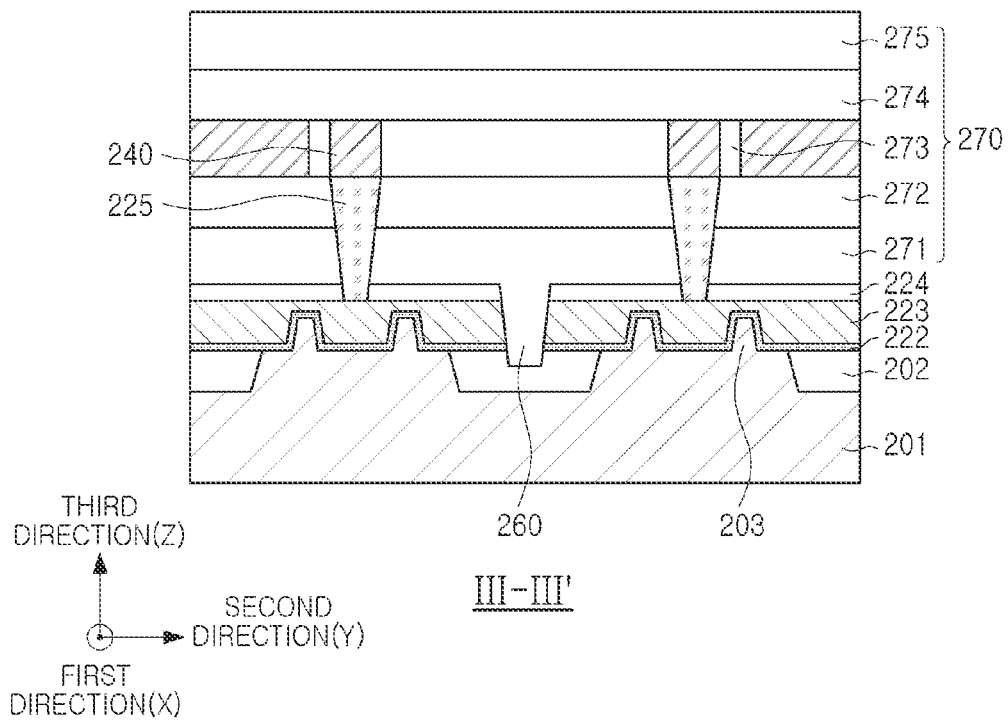
Figure 7:
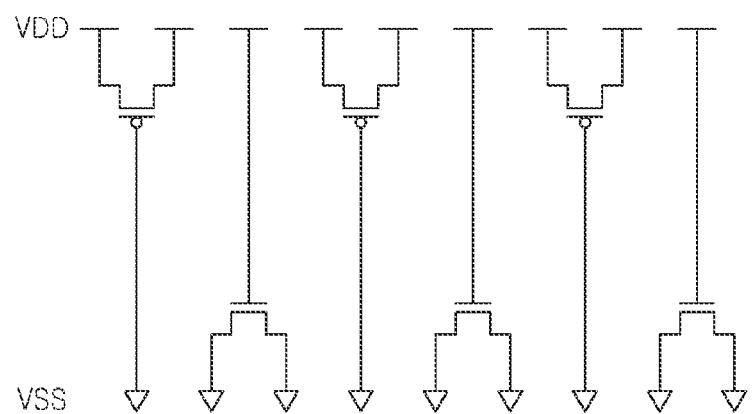
FIG. 7 is a circuit diagram illustrating a circuit corresponding to the first standard cell illustrated in FIG. 5.

FIG. 5 is a plan view illustrating a first standard cell SC1 according to some example embodiments. FIG. 6A is a cross-sectional view taken along line I-I' of FIG. 5, FIG. 6B is a cross-sectional view taken along line II-II' of FIG. 5, and FIG. 6C is a cross-sectional view taken along line III-III' of FIG. 5. FIG. 7 is a circuit diagram illustrating a circuit corresponding to the first standard cell SC1 illustrated in FIG. 5.

Referring to FIG. 5, the first standard cell SC1 may include first and second active regions 210 and 215 extending in a first direction X and gate structures 220 extending in a second direction Y and intersecting the first and second active regions 210 and 215. The first and second active regions 210 and 215 and the gate structures 220 may provide a plurality of semiconductor devices.

The first active regions 210 may be P-type MOS regions (PMOS regions) and the second active regions 215 may be N-type MOS regions (NMOS regions). One of the gate structures 220 and the first active regions 210, on first and second sides of the gate structure 220, may provide a PMOS transistor. In addition, one of the gate structures 220 and the second active regions 215, on first and second sides of the gate structure 220, may provide a NMOS transistor. The first and second active regions 210 and 215 may be connected to active contacts 230 adjacent to the gate structures 220, as seen in FIG. 6A. Transistors, included in each of the standard cells, may be connected to each other to provide a single unit capacitor circuit. Among the gate structures 220, gate structures arranged on an edge of the first standard cell SC1 may be dummy gate structures which do not provide a transistor.

The first standard cell SC1 may include lower interconnection patterns 240 connected to at least one of the gate structures 220 and the active contacts 230. In addition, the first standard cell SC1 may include upper interconnection patterns 250 connected to at least one of the lower interconnection patterns 240 through an upper via 245. As illustrated in FIG. 5, the lower interconnection patterns 240 may extend in the first direction X, and the upper interconnection patterns 250 may extend in the second direction Y. The lower interconnection patterns 240 and the upper interconnection patterns 250 may be formed of a conductive material such as a metal or metal silicide.

Referring to FIG. 7, the first standard cell SC1 may include a plurality of PMOS transistors and a plurality of NMOS transistors. A first power supply voltage VDD may be applied to active regions of the PMOS transistors, and a second power supply voltage VSS may be applied to gates of the PMOS transistors. In addition, the second power supply voltage VSS may be applied to active regions of the NMOS transistors, and the first power supply voltage VDD may be applied to gates of the NMOS transistors. Each of the PMOS transistors and the NMOS transistors may have capacitance. In the first standard cell SC1, PMOS transistors and NMOS transistors may be connected in parallel, and the first standard cell SC1 may be a unit capacitor circuit providing capacitance equal to a sum of the levels of capacitance of the PMOS transistors and the NMOS transistors.

Continuing to refer to FIG. 5, the gate structures 220 may be separated into gates of the PMOS transistors and gates of the NMOS transistors by a cut region 260. The first active regions 210, constituting the PMOS transistors, may be connected to the first power supply line M1(VDD) providing the first power supply voltage VDD through the active contacts 230. The second active regions 215, constituting the NMOS transistors, may be connected to the second power supply lines M1(VSS) providing the second power supply voltage VSS, lower than the first power supply voltage VDD, through the active contacts 230. The power supply lines M1(VDD) and M1(VSS) may be formed on the same layer as the lower interconnection patterns 240.

Gates of the PMOS transistors may be connected to one of the lower interconnection patterns 240 through a gate via 225. The active contact 230, connected to the second active regions 215, may be connected to another one of the lower interconnection patterns 240 through an active via 235. The lower interconnection pattern 240, connected to the gates of the PMOS transistors, may be connected to the lower interconnection pattern 240 connected to the second active regions 215 through the upper interconnection pattern 250. Accordingly, the second power supply voltage VSS may be applied to the gates of the PMOS transistors. Similarly, the lower interconnection patterns 240, to which gates of the NMOS transistors are connected, may be connected to the lower interconnection patterns 240 connected to the first active regions 210 through the upper interconnection patterns 250. Accordingly, the first power supply voltage VDD may be applied to the gates of the NMOS transistors.

Referring to FIGS. 6A to 6C, the first standard cell SC1 according to some example embodiments may include the first active regions 210 formed in the semiconductor substrate 201, the gate structures 220 between the first active regions 210, and the active contacts 230 connected to the first active regions 210. A channel region 203 may be defined between the first active regions 210 adjacent to each other in a first direction X, and at least one of the gate structures 220 may be arranged on the channel region 203. The gate structures 220 may extend in a second direction Y.

In the example embodiments described with reference to FIGS. 6A to 6C, it has been taken that the channel region 203 included in the first standard cell SC1 is provided by fin structures. However, the present disclosure is not limited thereto, and the channel region 203 included in the first standard cell SC1 may be implemented as a nanowire, a nanosheet, or the like, formed on the semiconductor substrate 201 to be surrounded by the gate structures 220. When the channel region 203 is implemented as a nanowire, a nanosheet, or the like, the channel region 203 may be separated from the semiconductor substrate 201 in a third or vertical direction Z. Alternatively, the channel region 203 may not protrude in the third direction Z, but may be formed to be coplanar with an upper surface of the channel region 203 on upper surfaces of the first active regions 210. In other words, in some embodiments each of the semiconductor devices may be implemented as a general horizontal transistor.

Referring to FIG. 6A, each of the gate structures 220 may include a gate spacer 221, a gate insulating layer 222, a gate conductive layer 223, a capping layer 224, and the like. However, a configuration and/or composition of each of the gate structures 220 may vary according to example embodiments. For example, a thickness and/or a material of the gate insulating layer 222, or a material and/or a stacked structure of the gate conductive layer 223, and/or other properties may vary in consideration of various characteristics, such as a threshold voltage of each of the semiconductor devices or the like. In the first standard cell SC1, the gate conductive layer 223, the gate insulating layer 222, and the channel region 203 may have a MOS structure and may provide capacitance.

The active contacts 230 may be adjacent to the gate structures 220 in the first direction X, and may be connected to the first active regions 210. The active contacts 230 may be formed of metal, metal silicide, polysilicon, or the like, and may include two or more layers formed of different materials. For example, each of the active contacts 230 may include a metal silicide layer and a metal layer. In some example embodiments, each of the active contacts 230 may include a metal silicide layer in direct contact with the first active regions 210 and a metal layer on the metal silicide layer.

At least one of the active contacts 230 may be connected to one of the lower interconnection patterns 240 through an active via 235 arranged thereon. The active via 235 and the lower interconnection patterns 240 may also include a plurality of layers. As an example, the active via 235 and the lower interconnection patterns 240a may include a barrier metal layer and a fill metal layer. According to some example embodiments, the lower interconnection patterns 240 and the barrier metal layer of the active via 235 may be connected as a single entity, and the lower interconnection patterns 240 and the fill metal layer may also be connected as a single entity.

Referring to FIG. 6B, at least one of the lower interconnection patterns 240 may be connected to the upper interconnection patterns 250 through the upper via 245. For example, a layer in which the lower interconnection patterns 240 are arranged may be defined as a first interconnection layer, and a layer in which the upper interconnection patterns 250 are arranged may be defined as a second interconnection layer.

In some example embodiments, some positions, such as positions of the lower interconnection patterns 240 on the first interconnection layer, may be predefined in each of the standard cells. On the other hand, in some example embodiments, some positions, such as positions of at least some of the interconnection patterns on the second interconnection layer may not be predefined in each of the standard cells. After standard cells are arranged during a place-and-routing process, positions of the upper interconnection patterns 250 in the second interconnection layer may be determined to connect the standard cells to each other.

The first standard cell SC1 may include an interlayer insulating layer 270, and the interlayer insulating layer 270 may include a plurality of interlayer insulating layers 271 to 275. For example, the first interlayer insulating layer 271 may be arranged at the same height as the gate structures 220 and the active contacts 230, and the second interlayer insulating layer 272 may be arranged at the same height as an upper portion of the gate via 225 and the active via 235. The third interlayer insulating layer 273 may be arranged at the same height as the first interconnection layer 240, the fourth interlayer insulating layer 274 may be arranged at the same height as the upper via 245, and the fifth interlayer insulating layer 275 may be arranged at the same height as the second interconnection layer 250. The interlayer insulating layer 270 may be formed of silicon oxide, silicon nitride, silicon oxynitride, or the like.

Referring to FIG. 6B, semiconductor devices may be separated from each other in the first standard cell SC1 by a device isolation layer 202 formed on the semiconductor substrate 201. For example, the semiconductor devices on opposite sides of the device isolation layer 202 in the second direction Y may be a PMOS device and an NMOS device, respectively.

Referring to FIG. 6C, the channel region 203 may be provided by fin structures extending in the third direction Z, that are perpendicular to an upper surface of the semiconductor substrate 201. In the gate structures 220, the gate insulation layer 222 may have a shape passing over the fin structures. In other words, both side surfaces and upper surfaces of the fin structures may be in contact with the gate insulating layer 222. Referring to FIG. 6B, the gate insulating layer 222 may be in contact with the side surfaces and the upper surfaces of the fin structures, and a gate conductive layer 223 and a capping layer 224 may be formed on the gate insulating layer 222.

Referring to FIG. 6C, and as discussed with reference to FIG. 5m the gate structures 220 may be separated by a cut region 260. The gate via 225 may be connected to the gate conductive layer 223 included in the separated gate structure 220 and may penetrate through, for example, the first and second interlayer insulating layers 271 and 272. A lower surface of the gate via 225 may be in contact with the gate conductive layer 223, and an upper surface of the gate via 225 may be arranged at a position higher than an upper surface of the active contacts 230. For example, an upper surface of the gate via 225 may be arranged at the same height as an upper surface of the second interlayer insulating layer 272.

The gate via 225 may be connected to at least one of the lower interconnection patterns 240 extending in the first interconnection layer in the first direction X. The lower interconnection patterns 240 may be arranged at the same height as the power supply lines M1(VDD) and M1(VSS) extending along the boundary between the standard cells in the first direction.

As described above with reference to FIG. 6B, semiconductor devices may be separated from each other by the device isolation layer 202 formed on the semiconductor substrate 201. For example, semiconductor devices on opposite sides of a single device isolation layer 202 in the second direction Y may be a PMOS device and an NMOS device, respectively. Accordingly, the first active regions 210 and the second active regions 215 on different sides of the isolation layer 202 may be doped with impurities having opposite conductivity types.

As described above, the active regions 210 and 215 may be connected to the channel region 203 in the first direction X. For example, the active regions 210 and 215 may be formed by applying a selective epitaxial growth process to the semiconductor substrate 201. The active regions 210 and 215 may be connected to the active contacts 230. For example, the active contacts 230 may be formed to have a shape within recessing portions or recessed portions of the active regions 210 and 215. Through the active contacts 230, the first active regions 210 physically separated from each other in the first direction X may be electrically connected to each other and the second active regions 215 may also be electrically connected to each other.

Referring to FIG. 6B, a lower surface of the active via 235 may be arranged at the same height as an upper surface of the first interlayer insulating layer 271 and may be in contact with the active contacts 230. Accordingly, the lower surface of the active via 235 may be between upper surface of the gate structures 220 and an upper surface of the gate via 225 in the third direction Z. However, the present disclosure is not limited thereto, and the arrangement shapes and heights of the active contacts 230, the gate structures 220, and the gate via 225 may vary according to example embodiments.

As described with reference to FIGS. 5 to 7, the first standard cell SC1 may include a plurality of PMOS transistors and a plurality of NMOS transistors. The transistors may be connected in a predetermined structure, and the first standard cell SC1 may provide a unit capacitor circuit having capacitance determined depending on the connection structure of the transistors. According to some example embodiments, the transistors included in the standard cell may be connected to a structure, different from the structure described with reference to FIGS. 5 to 7, to have a capacitance different from the capacitance of the first standard cell SC1. Hereinafter, standard cells including transistors connected in a structure different from the structure of the first standard cell SC1 will be described.

Figure 8:
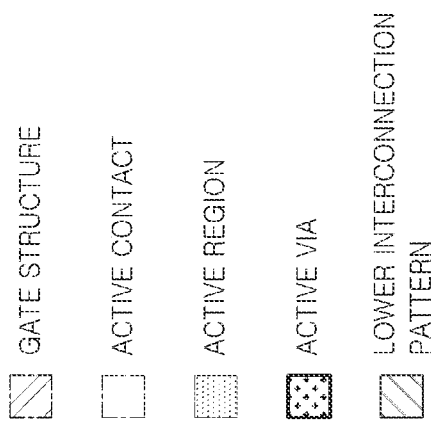
FIG. 8 is a plan view illustrating a second standard cell according to some example embodiments.
Figure 8:
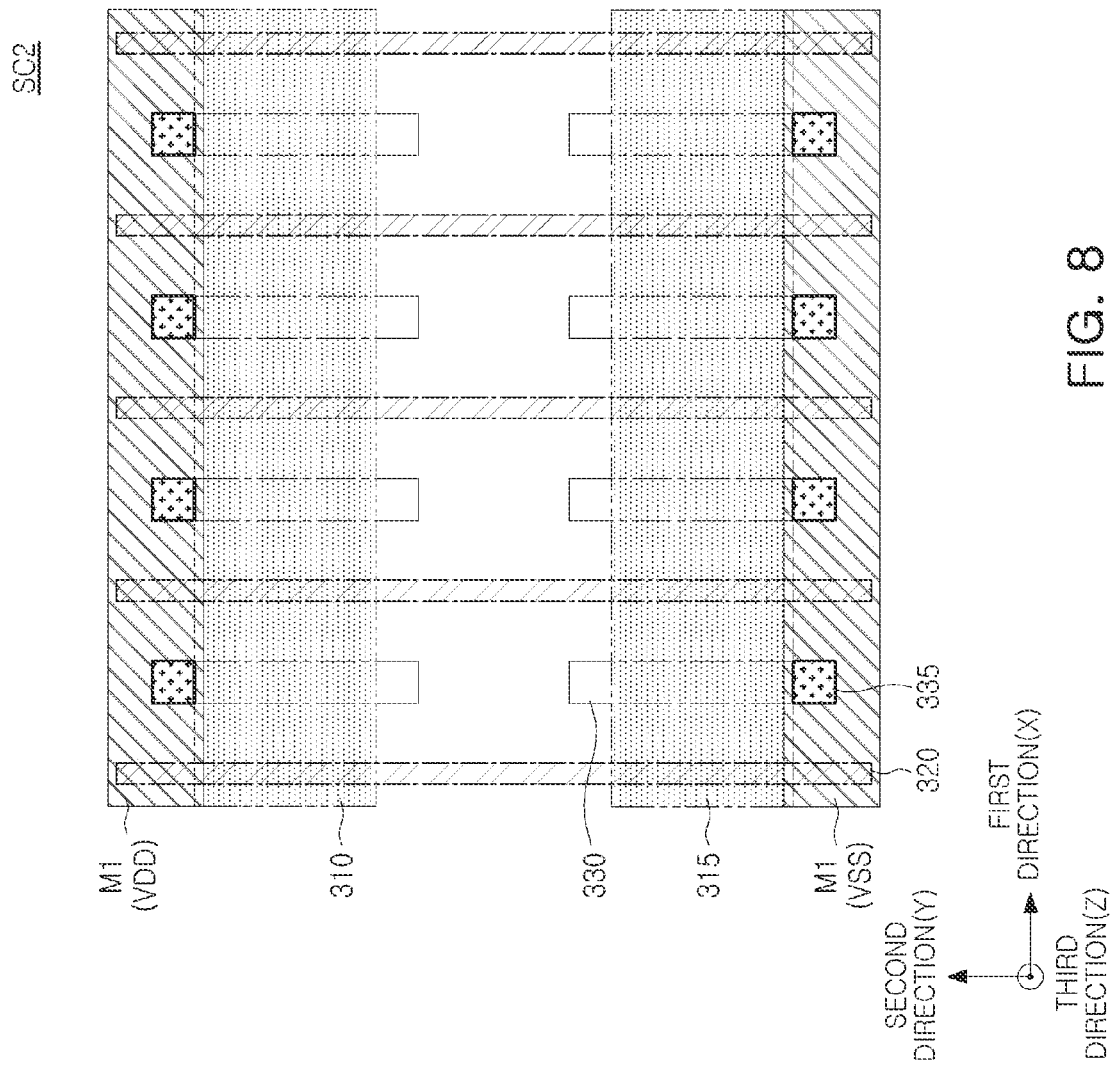
Figure 9:
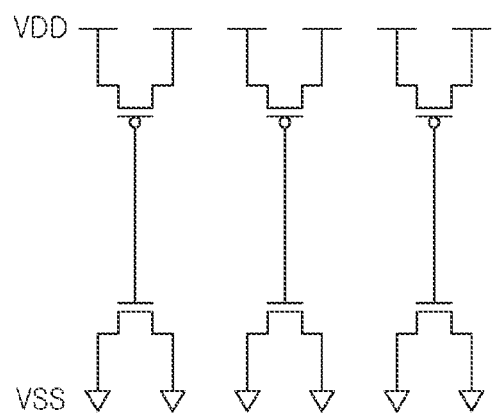
FIG. 9 is a circuit diagram illustrating a circuit corresponding to the second standard cell illustrated in FIG. 8.

FIG. 8 is a plan view illustrating a second standard cell SC2 according to some example embodiments. FIG. 9 is a circuit diagram illustrating a circuit corresponding to the second standard cell SC2 illustrated in FIG. 8.

Referring to FIG. 8, the second standard cell SC2 may include first and second active regions 310 and 315 extending in a first direction X and gate structures 320 extending in a second direction Y and intersecting the second active regions 310 and 315. One of the gate structures 320 and the first active regions 310 on first and second sides thereof may provide a PMOS transistor. In addition, one of the gate structures 320 and the second active regions 315 on first and second sides thereof may provide a NMOS transistor. The first and second active regions 310 and 315 may be connected to active contacts 330 adjacent to the gate structures 320. The gate structures 320 may extend across the first active regions 310 and the second active regions 315. Accordingly, a gate of each of the PMOS transistors may be connected to a gate of the NMOS transistor.

The second standard cell SC2 may include lower interconnection patterns 340 connected to the active contacts 330. In the example of FIG. 8, one of the lower interconnection patterns 340 may be connected to the first active regions 310 through the active contacts 330 to provide a first power supply voltage VDD to the first active regions 310. Another one of the lower interconnection patterns 340 may be connected to the second active regions 315 through the active contacts 330 to provide the second power supply voltage VSS to the second active regions 315.

Referring to FIG. 9, the second standard cell SC2 may include a plurality of PMOS transistors and a plurality of NMOS transistors. A first power supply voltage VDD may be applied to active regions of the PMOS transistors, and a second power supply voltage VSS may be applied to active regions of the NMOS transistors. A gate of each of the PMOS transistors may be connected to a gate of the NMOS transistor. A gate of each of the PMOS transistors and a gate of each of the NMOS transistors may be floated. For example, a power supply voltage may not be applied to the gates.

In the second standard cell SC2, each of the PMOS transistors and the NMOS transistors may have capacitance. The second standard cell SC2 may provide a unit capacitor circuit having capacitance determined depending on a connection structure of the PMOS transistors and the NMOS transistors.

Figure 10:
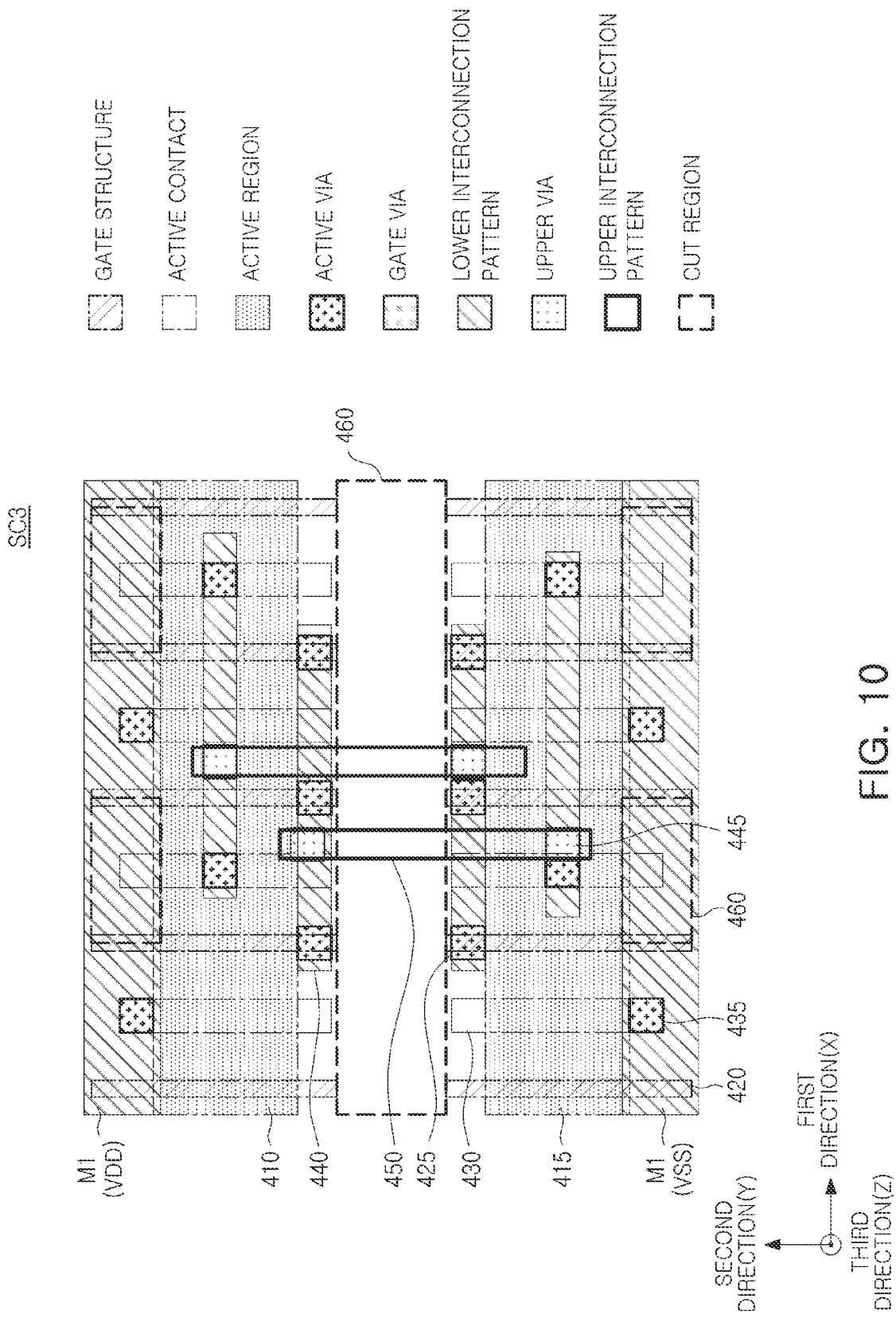
FIG. 10 is a plan view illustrating a third standard cell according to some example embodiments.
Figure 11:
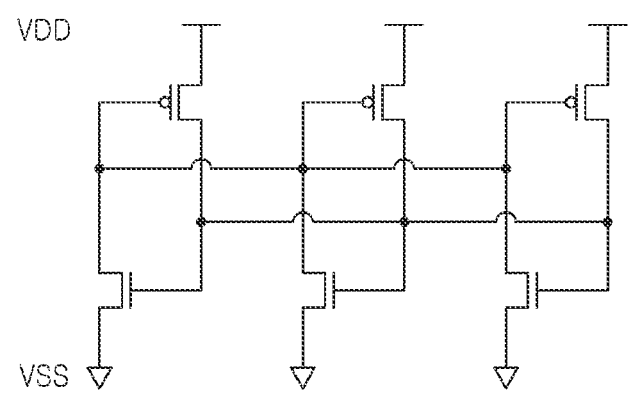
FIG. 11 is a circuit diagram illustrating a circuit corresponding to the third standard cell illustrated in FIG. 10.

FIG. 10 is a plan view illustrating a third standard cell SC3 according to some example embodiments. FIG. 11 is a circuit diagram illustrating a circuit corresponding to the third standard cell SC3 illustrated in FIG. 10.

Referring to FIG. 10, the third standard cell SC3 may include first and second active regions 410 and 415 respectively extending in a first direction X, and gate structures 420 extending in a second direction Y and intersecting the second active regions 410 and 415. One of the gate structures 420 and first active regions 410 on first and second sides thereof may provide a PMOS transistor, and one of the gate structures 420 and second active regions 415 on first and second sides thereof may provide a NMOS transistors. The first and second active regions 410 and 415 may be connected to active contacts 430 adjacent to the gate structures 420.

The third standard cell SC3 may include lower interconnection patterns 440 connected to at least one of the gate structures 420 and the active contacts 430. The lower interconnection patterns 440 may include a first power supply line M1(VDD) connected to the first active regions 410 through the active contacts 430, and a second power supply line M1(VSS) connected to the second active regions 415 through the active contacts 430. In addition, the lower interconnection patterns 440 may include interconnection patterns connected to upper interconnection patterns 450 through an upper via 445.

Referring to FIG. 11, the third standard cell SC3 may include a plurality of PMOS transistors and a plurality of NMOS transistors. Drain regions of the PMOS transistors may be provided with a first power supply voltage VDD, and source regions of the NMOS transistors may be provided with a second power supply voltage VSS. A gate of each of the PMOS transistors may be connected to a drain region of the NMOS transistor, and a gate of each of the NMOS transistors may be connected to a source region of the PMOS transistor. According to some example embodiments, the gates of PMOS transistors may be connected to each other, and the gates of the NMOS transistors may also be connected to each other.

Returning to FIG. 10, the first active regions 410 may include active regions, connected to the first power supply line M1(VDD) through active contacts 430, and active regions separated from the power supply line M1(VDD) by a cut region 460. The active regions connected to the first power supply line M1(VDD) and the active regions separated from the first power supply line M1(VDD) may be alternately arranged in the first direction X. For example, in each of the PMOS transistors, one of the active regions may be connected to the first power supply line M1(VDD) and another one thereof may be separated from the first power supply line M1(VDD) by the cut region 460.

Similarly to the PMOS transistors, in each of the NMOS transistors, one of the second active regions 415 may be connected to the second power supply line M1(VSS) and another of the second active regions 415 may be separated from the second power supply line M1(VSS).

The gate structures 420 may be separated into gates of PMOS transistors and gates of NMOS transistors by the cut region 460. The gates of the PMOS transistors may be connected to each other through one of the lower interconnection patterns 440. Among the first active regions 410, active regions separated from the first power supply line M1(VDD) may be connected through another one of the lower interconnection patterns 440. A lower interconnection pattern 440, connecting the gates of the PMOS transistors to each other, and a lower interconnection pattern 440, connecting the second active regions 415 separated from the second power supply line M1(VSS) to each other, may be connected to each other through one of the upper interconnection patterns 450. Similarly, a lower interconnection pattern 440 connecting first active regions 410 separated from the first power supply line M1(VDD) to each other, may be connected to a lower interconnection pattern 440 connecting the gates of the NMOS transistors to each other through another one of the upper interconnection patterns 450.

The third standard cell SC3 may provide a unit capacitor circuit having capacitance determined depending on a connection structure of PMOS transistors and the NMOS transistors.

Figure 12:
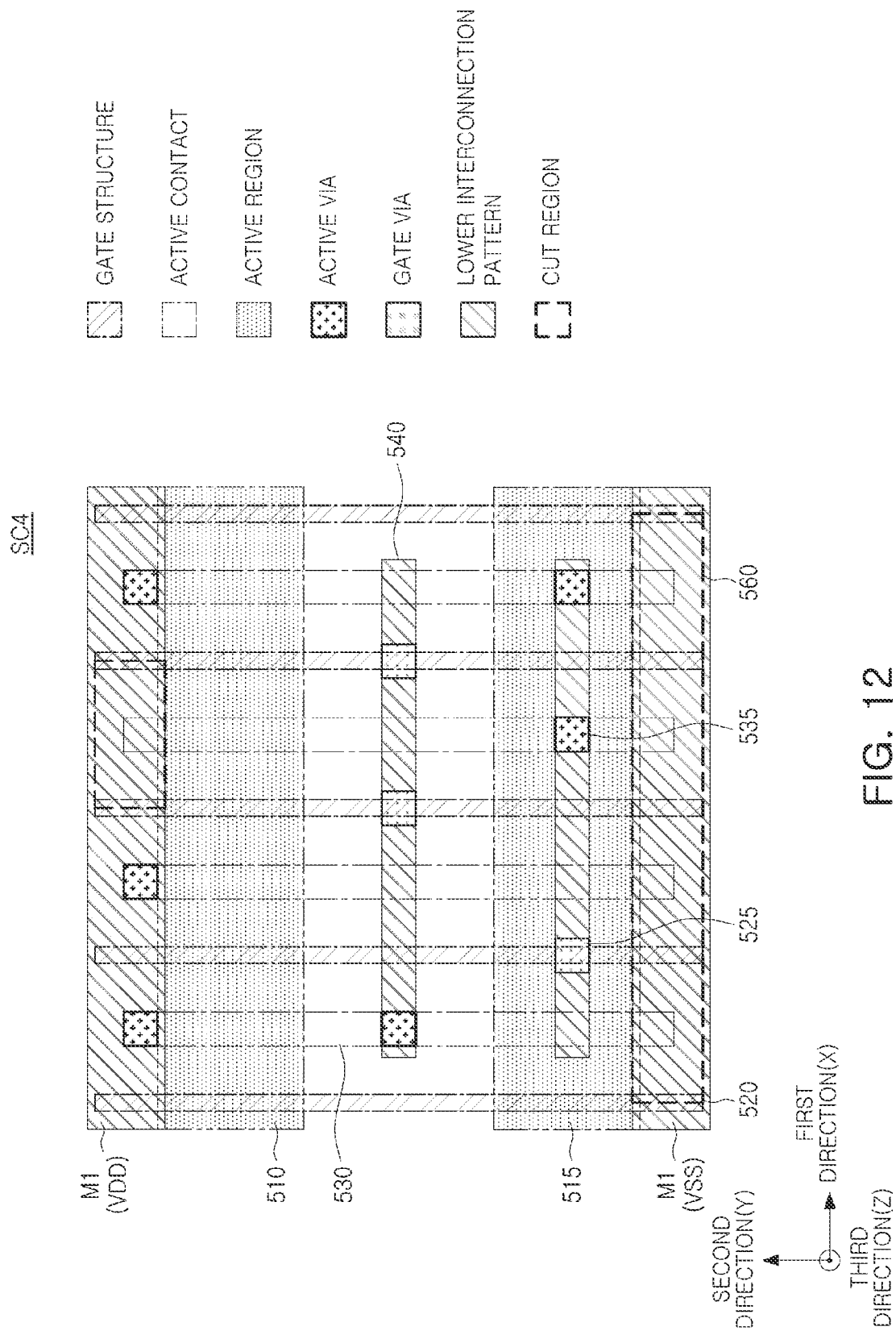
FIG. 12 is a plan view illustrating a fourth standard cell according to some example embodiments.
Figure 13:
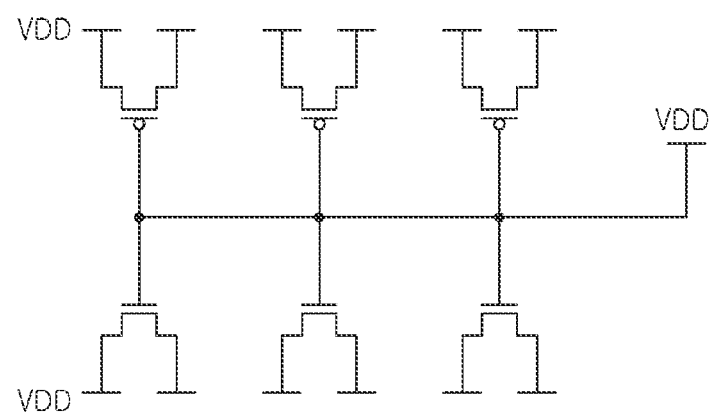
FIG. 13 is a circuit diagram illustrating a circuit corresponding to the fourth standard cell illustrated in FIG. 12.

FIG. 12 is a plan view illustrating a fourth standard cell SC4 according to some example embodiments, and FIG. 13 is a circuit diagram illustrating a circuit corresponding to the fourth standard cell SC4 illustrated in FIG. 12.

Referring to FIG. 12, the fourth standard cell SC4 may include first and second active regions 510 and 515, respectively extending in a first direction X and gate structures 520 extending in a second direction Y and intersecting the second active regions 510 and 515. One of the gate structures 520 and first active regions 510 on first and second sides thereof, may provide a PMOS transistor, and one of the gate structures 520 and the second active regions 515, on first and second sides thereof may provide a NMOS transistor. The fourth standard cell SC4 may include lower interconnection patterns 540 connected to at least one of the gate structures 520 and to active contacts 530.

Referring to FIG. 13, the fourth standard cell SC4 may include a plurality of PMOS transistors and a plurality of NMOS transistors. A first power supply voltage VDD may be applied to active regions of the PMOS transistors and active regions of the NMOS transistors. Also, the first power supply voltage VDD may be applied to gate regions of the PMOS transistors and gate regions of the NMOS transistors.

Returning to FIG. 12, a portion of the first active regions 510 may be directly connected to the first power supply line M1(VDD) through the active via 535, and another portion of the first active regions 510 may be connected to the first power supply line M1(VDD) through the active region of the electrically connected NMOS transistor. Accordingly, the first power supply voltage VDD may be applied to active regions of the PMOS transistors.

The second active regions 515 may be separated from the second power supply line M1(VSS) by a cut region 560. In addition, the second active regions 515 may be provided with a first power supply voltage VDD from the first power supply line M1(VDD) through the lower interconnection patterns 540 between the first power supply line M1(VDD) and the second power supply line M1(VSS) in the second direction Y. Accordingly, the first power supply voltage VDD may be applied to the active regions of the NMOS transistors.

The gate structures 520 may extend across the first active regions 510 and the second active regions 515. The gate structures 520 may be provided with the first power supply voltage VDD from the first power supply line M1(VDD) through the lower interconnection patterns 540 and gate vias 525. Accordingly, the first power supply voltage VDD may be applied to the gates of the NMOS transistors and the PMOS transistors.

The fourth standard cell SC4 may provide a unit capacitor circuit having capacitance determined depending on a connection structure of the PMOS transistors and the NMOS transistors.

According to some example embodiments, a standard cell library may provide various standard cells including standard cells SC1 to SC4. The standard cells SC1 to SC4 may provide a unit capacitor circuit having capacitance determined depending on a connection structure of gates and active regions of the PMOS transistors and the NMOS transistors. Hereinafter, some examples of standard cells, having levels of capacitance of which magnitudes are different depending on connection structures, will be described with reference to FIGS. 14A and 14B.

Figure 14A:
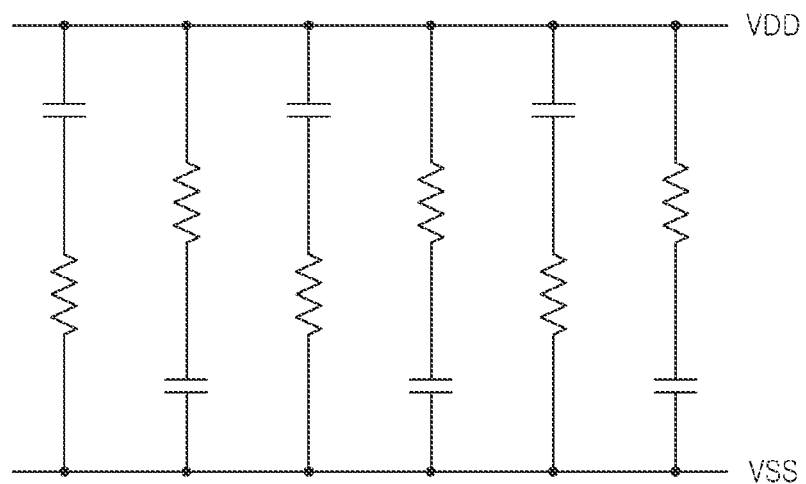
FIG. 14A is a circuit diagram illustrating an equivalent circuit of a circuit of the first standard cell.
Figure 14B:
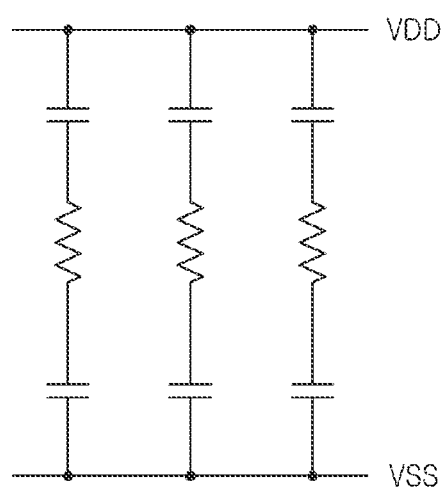
FIG. 14B is a circuit diagram illustrating an equivalent circuit of a circuit of the second standard cell.

FIG. 14A is a circuit diagram illustrating an equivalent circuit of a circuit of the first standard cell SC1 described with reference to FIG. 7, and FIG. 14B is a circuit diagram illustrating an equivalent circuit of a circuit of the second standard cell SC2 described with reference to FIG. 9.

Returning to FIG. 7, each of the PMOS transistors and the NMOS transistors, included in the first standard cell SC1, may provide a MOS capacitor. Since the second power supply voltage VSS is applied to each of the gates of the PMOS transistors, the PMOS transistors may be in an ON state. Since the same first power supply voltage VDD is applied to the active regions of the PMOS transistors, a leakage current flowing through a channel between the active regions may not be generated, but a slight leakage current may be generated through a gate. Accordingly, each of the PMOS transistors may be approximated by a capacitor and a resistor connected in series. Since the first power supply voltage VDD is applied to each of the gates of the NMOS transistors, the NMOS transistors may also be in an ON state. Leakage current flowing through a gate may also be generated in the NMOS transistors, and each of the NMOS transistors may be approximated by a capacitor and a resistor connected in series. FIG. 14A illustrates a circuit in which each of the PMOS transistors and the NMOS transistors of the first standard cell SC1 is approximated by a capacitor and a resistor connected in series.

Returning to FIG. 9, each of the PMOS transistors and the NMOS transistors, included in the second standard cell SC2, may provide a MOS capacitor. Referring to FIG. 14B, a pair of PMOS transistors and NMOS transistors may be approximated by two capacitors and a resistor connected in series.

Comparing FIG. 14A with FIG. 14B, standard cells having different connection structures between active regions and gates of PMOS transistors and NMOS transistors may have different levels of capacitance. For example, capacitance of a first standard cell SC1, to which all transistors are connected in parallel, may be higher than that of a second standard cell SC1 to which transistors are connected in parallel and in series.

According to some example embodiments, standard cells included in a standard cell array may each be selected from the standard cells SC1 to SC4. According to a combination of the standard cells SC1 to SC4 having various levels of capacitance, a lower capacitor 200 having target capacitance may be formed.

Referring to FIGS. 4A to 14B, descriptions of some example embodiments have been provided for cases in which first power supply lines M1(VDD) and second power supply lines M1(VSS) are alternately arranged in a standard cell array, standard cells included in the standard cell arrays include PMOS transistors and NMOS transistors, and the PMOS transistors are connected to a first power supply line M1(VDD). However, the present disclosure and example embodiments thereof are not limited to the above case. For example, in the standard cell array, a power supply voltage applied to power supply lines extending in a first direction X and a conductivity type of impurities doped in the active regions included in each of the plurality of standard cells may be different from those illustrated in FIGS. 4 to 14B.

Hereinafter, various example embodiments will be described with reference to FIGS. 15 to 24B.

Figure 15:
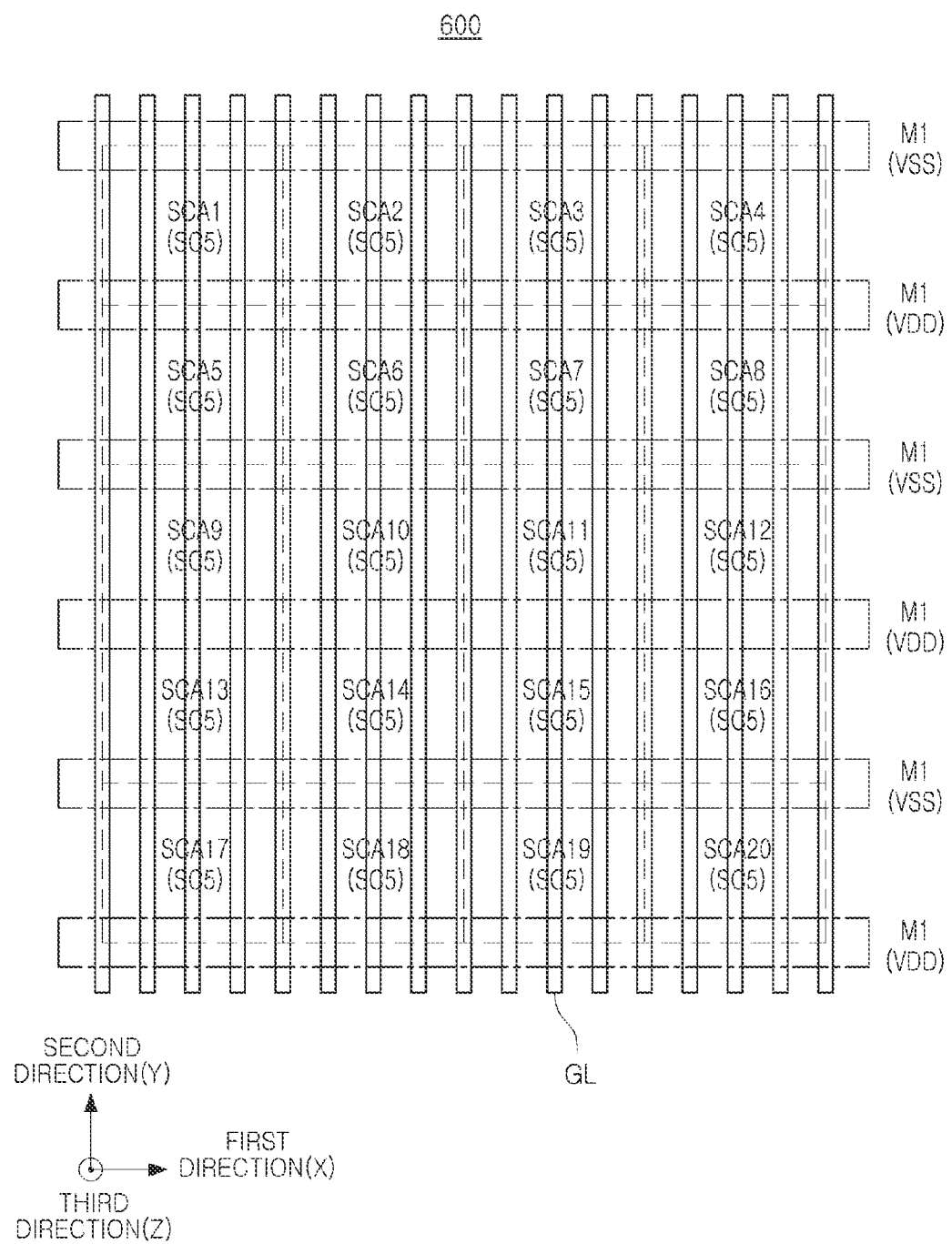
FIG. 15 is a plan view illustrating a lower capacitor according to some example embodiments.

FIG. 15 is a plan view illustrating a lower capacitor 600 according to some example embodiments. For example, FIG. 15 illustrates a standard cell array and power supply lines according to some example embodiments.

Referring to FIG. 15, a lower capacitor 600 may include a standard cell array and power supply lines. The lower capacitor 600 may correspond to the lower capacitor 150 described with reference to FIGS. 2A and 2B.

The standard cell array includes standard cell regions SCA1 to SCA20 in a first direction X and a second direction Y, and gate patterns GL extending in the second direction Y. The first direction X and the second direction Y may intersect each other and both may be parallel to the upper surface of a substrate. The standard cell regions SCA1 to SCA20, the gate patterns GL, and the power supply lines may be arranged to be similar to those described with reference to FIGS. 4A and 4B. However, the standard cell regions SCA1 to SCA20 may include the fifth standard cell SC5, and an order in which the first power supply lines M1(VDD) and the second power supply lines M1(VSS) are arranged may be reverse from that illustrated in FIG. 4B. It is a matter of course that in the standard cell array, more various standard cells may be in more standard cell regions.

The fifth standard cells SC5 arranged in the standard cell regions SCA1 to SCA20 may provide a unit capacitor circuit, and each of the fifth standard cells SC5 may be connected to the capacitor structure 140 in parallel to supplement capacitance of the capacitor structure 140. Hereinafter, an exemplary structure of the fifth standard cell SC5 will be described with reference to FIGS. 16 to 17.

Figure 16:
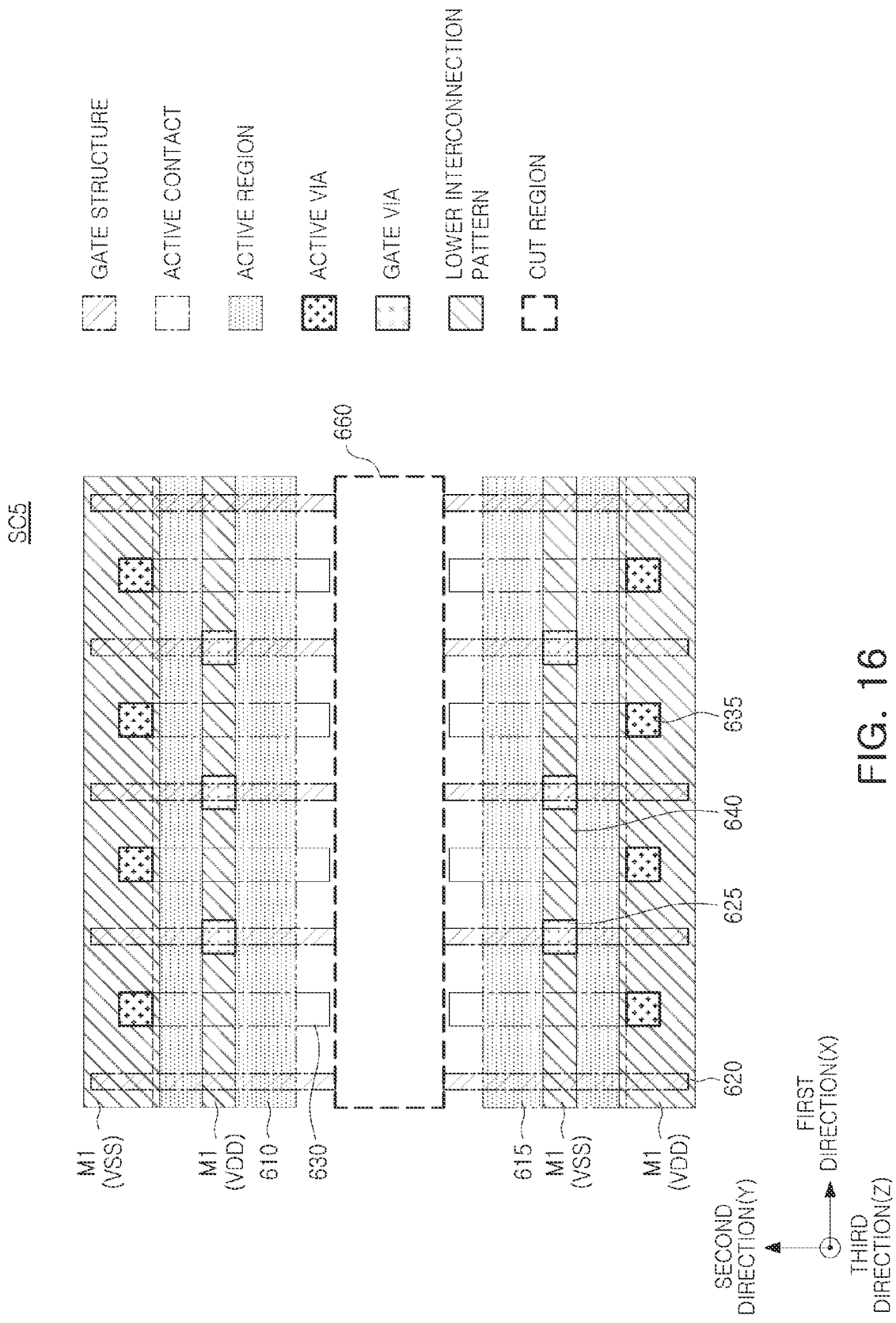
FIG. 16 is a plan view illustrating a fifth standard cell according to some example embodiments.
Figure 17:
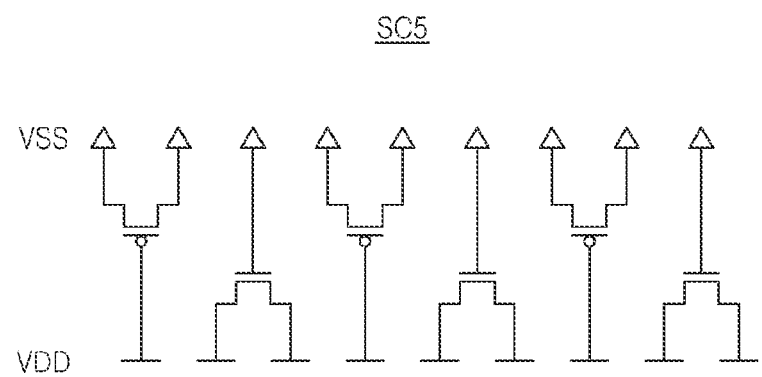
FIG. 17 is a circuit diagram illustrating a circuit corresponding to the fifth standard cell illustrated in FIG. 16.

FIG. 16 is a plan view illustrating a fifth standard cell SC5 according to some example embodiments, and FIG. 17 is a circuit diagram illustrating a circuit corresponding to the fifth standard cell SC5.

Referring to FIG. 16, the fifth standard cell SC5 may include first and second active regions 610 and 615 respectively extending in a first direction X, and gate structures 620 extending in a second direction Y and intersecting the first and second active regions 610 and 615. The first and second active regions 610 and 615 and the gate structures 620 may provide a plurality of semiconductor devices.

For example, one of the gate structures 620 and the first active regions 610 on opposite sides thereof may provide a PMOS transistor. In addition, one of the gate structures 620 and the second active regions 615, on opposite sides thereof may provide a NMOS transistor. The first and second active regions 610 and 615 may be connected to active contacts 630 adjacent to the gate structures 620. The fifth standard cell SC5 may include lower interconnection patterns 640 connected to at least one of the gate structures 620 and the active contacts 630.

Referring to FIG. 17, the fifth standard cell SC5 may include a plurality of PMOS transistors and a plurality of NMOS transistors. A second power supply voltage VSS may be applied to active regions of the PMOS transistors, and a first power supply voltage VDD may be applied to active regions of the NMOS transistors. In the standard cells SC1 to SC4 and the fifth standard cell SC5, power supply voltages applied to active regions of the PMOS transistors and active regions of the NMOS transistor may be opposite to each other. A first power supply voltage VDD may be applied to gates of the PMOS transistors, and a second power supply voltage VSS may be applied to gates of the NMOS transistors.

Returning to FIG. 16, the semiconductor device may include power supply lines, extending along boundaries of the fifth standard cell SC5, and power supply lines extending across the fifth standard cell SC5. A power supply line extending along the boundary of the fifth standard cell SC5 and providing the first power supply voltage VDD may be referred to as a first power supply line and a power supply line extending along the boundary of the fifth standard cell SC5 and providing the second power supply voltage VSS, may be referred as a second power supply line. A power supply line extending across the fifth standard cell SC5 and providing the first power supply voltage VDD may be referred to as a third power supply line, and a power supply line extending across the fifth standard cell SC5 and providing the second power supply voltage VSS may be referred to as a fourth power supply line. The first to fourth power supply lines may be formed as lower interconnection patterns 640 on the same interconnection layer.

Continuing to refer to FIG. 16, the gate structures 620 may be separated into gates of the PMOS transistor and gates of the NMOS transistor by a cut region 660. The first active regions 610 constituting the PMOS transistors may be connected to a second power supply line M1(VSS) providing a second power supply voltage VSS through active contacts 630. In addition, the gates of the PMOS transistors may be connected to a third power supply line M1(VDD) providing the first power supply voltage VDD. The second active regions 615 constituting the NMOS transistors may be connected to a first power supply line M1(VDD) providing the first power supply voltage VDD through active contacts 630. In addition, the gates of the NMOS transistors may be connected to a fourth power supply line M1(VSS) providing the second power supply voltage VSS.

The fifth standard cell SC5 may provide a unit capacitor circuit having capacitance determined depending on a connection structure of the PMOS transistors and the NMOS transistors. For example, each of the PMOS transistors and the NMOS transistors, included in the fifth standard cell SC5, may provide capacitance.

Since the second power supply voltage VSS is equivalently applied to the gates and the drains of the PMOS transistors, leakage current flowing through a channel between the gate and the drain of the PMOS transistor may not be generated. In addition, since the first power supply voltage VDD is applied to the gates of the PMOS transistors, the PMOS transistors may be in an OFF state. Therefore, leakage current flowing through a gate may also not be generated in the PMOS transistors. Similarly, in NMOS transistors, leakage current flowing through a channel or leakage current flowing through a gate may not be generated.

Figure 18:
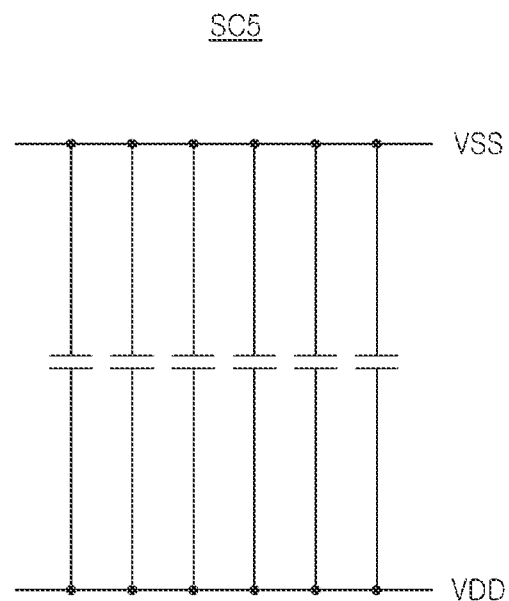
FIG. 18 is a circuit diagram illustrating an equivalent circuit of the fifth standard cell.

FIG. 18 is a circuit diagram illustrating an equivalent circuit of the fifth standard cell SC5 described with reference to FIG. 17. Since leakage current may not be generated in transistors included in the fifth standard cell SC5, each of the transistors may be approximated by a capacitor. Accordingly, the fifth standard cell SC5 may be approximated as a circuit including capacitors connected in parallel.

As compared with the first standard cell SC1 described with reference to FIG. 14A, the fifth standard cell SC5 may have capacitance having a magnitude similar to the magnitude of the capacitance of the first standard cell SC1. Unlike the first standard cell SC1, generation of leakage current in the fifth standard cell SC5 may be reduced, e.g., significantly reduced. For example, according to some example embodiments, standard cells may have leakage currents having magnitudes that differ depending on the connection structures of the gates and active regions of the PMOS transistors and the NMOS transistors.

Figure 19:
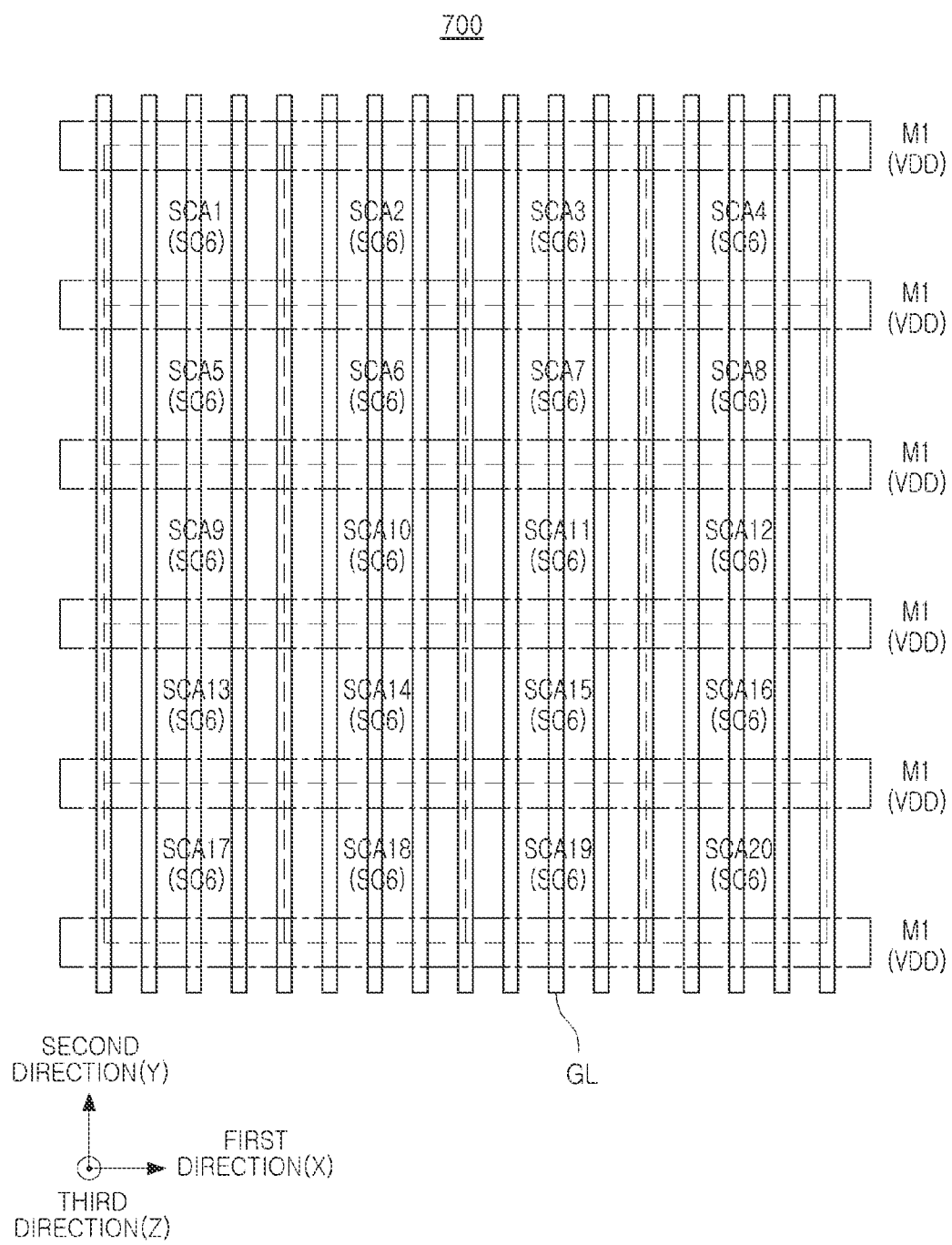
FIG. 19 is a plan view illustrating a lower capacitor according to some example embodiments.

FIG. 19 is a plan view illustrating a lower capacitor 700 according to some example embodiments. For example, FIG. 19 is a plan view illustrating a standard cell array and power supply line according to some example embodiments.

Referring to FIG. 19, the lower capacitor 700 may include a standard cell array and power supply lines. The lower capacitor 700 may correspond to the lower capacitor 150 described with reference to FIGS. 2A and 2B.

The standard cell array may include standard cell regions SCA1 to SCA20 arranged in a first direction X, and a second direction Y, and gate patterns GL extending in the second direction Y. The first direction X and the second direction Y may intersect each other and may both be parallel to the upper surface of a substrate. The standard cell regions SCA1 to SCA20, the gate patterns GL, and the power supply lines of the lower capacitor 700 may be similar to those described with reference to FIGS. 4A and 4B. However, the standard cell regions SCA1 to SCA20 may include a sixth standard cell SC6, and each of the power supply lines may be first power supply lines M1(VDD) providing a first power supply voltage VDD. It is a matter of course that in a standard cell array, more various standard cells may be disposed in more standard cell regions.

Sixth standard cells SC6 arranged in the standard cell regions SCA1 to SCA20 may provide a unit capacitor circuit. Each of the sixth standard cells SC6 may be connected to the capacitor structure 140 in parallel to supplement capacitance of the capacitor structure 140. Hereinafter, an exemplary structure of the sixth standard cell SC6 will be described with reference to FIGS. 20A to 21B.

Figure 20A:
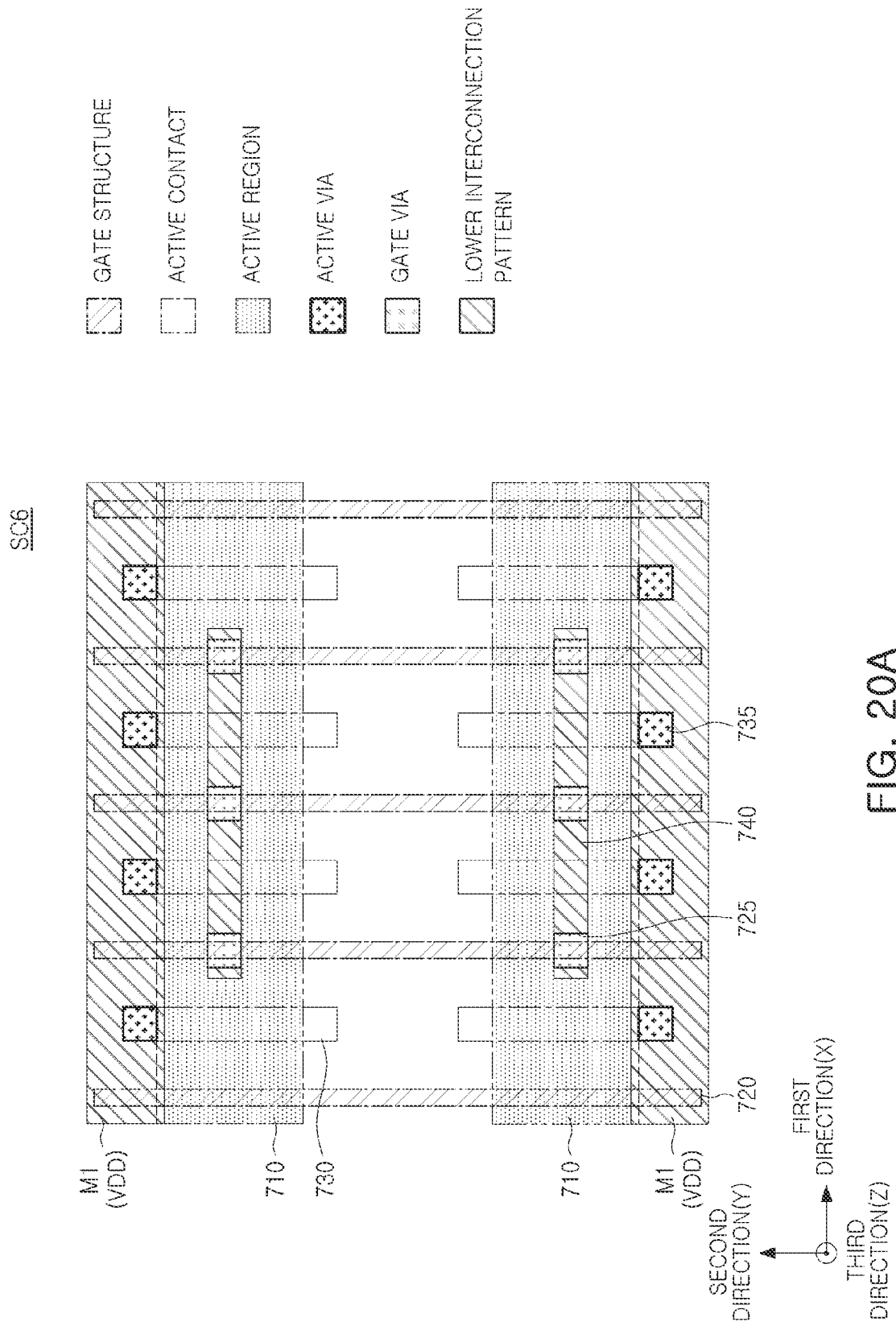
FIGS. 20A and 20B are plan views illustrating a sixth standard cell according to some example embodiments.
Figure 20B:
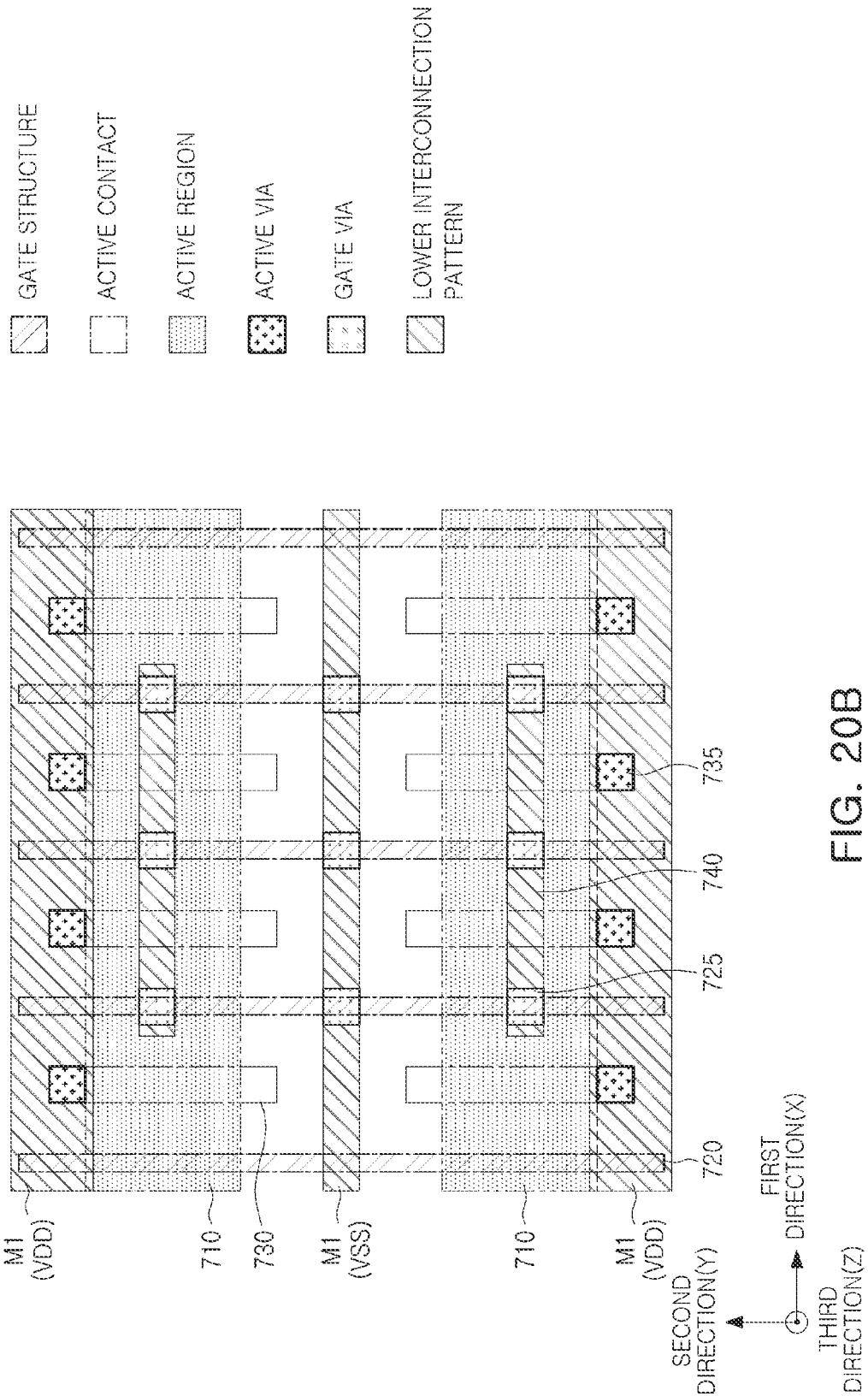
Figure 21A:
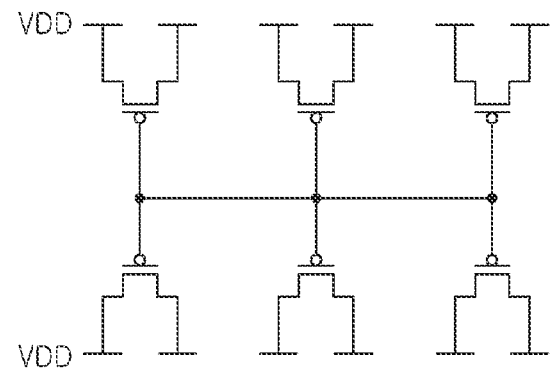
FIGS. 21A and 21B are circuit diagrams illustrating a circuit corresponding to the sixth standard cell illustrated in FIGS. 20A and 20B.
Figure 21B:
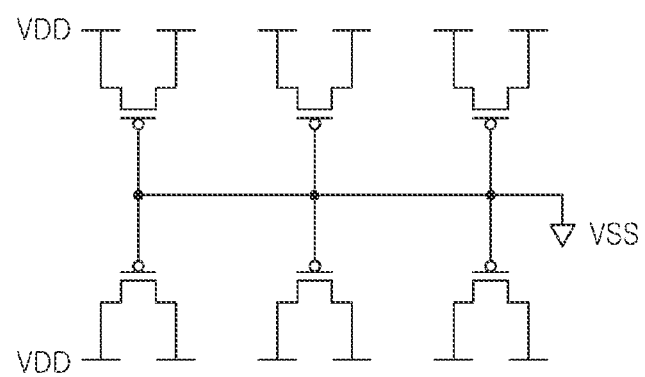

FIGS. 20A and 20B are plan views illustrating a sixth standard cell SC6 according to some example embodiments. FIG. 21A is a circuit diagram illustrating a circuit corresponding to the sixth standard cell SC6 according to the example embodiment illustrated in FIG. 20A, and FIG. 21B is a circuit diagram illustrating a circuit corresponding to the sixth standard cell SC6 according to the example embodiment illustrated in FIG. 20B.

Referring to FIG. 20A, the sixth standard cell SC6 may include active regions 710 extending in a first direction X and gate structures 720 extending in a second direction Y and intersecting the active regions 710. The active regions 710 and the gate structures 720 may provide a plurality of semiconductor devices.

For example, one of the gate structures 720 and active regions 710 on opposite sides thereof, may provide a PMOS transistor. The active regions 710 may include active contacts 730 adjacent to the gate structures 720. The sixth standard cell SC6 may include lower interconnection patterns 740 connected to at least one of the gate structures 720 and the active contacts 730.

Referring to FIG. 21A, the sixth standard cell SC6 may include a plurality of PMOS transistors. A first power supply voltage VDD may be applied to active regions of the PMOS transistors. All of gates of PMOS transistors may be connected to each other. In the example of FIG. 21A, the connected gates of the PMOS transistors may be floated.

Returning to FIG. 20A, first power supply lines M1(VDD) may be arranged at boundaries of the sixth standard cell SC6, and active regions 710 may be connected to each of the first power supply lines M1(VDD). The gate structures 720 may extend in the second direction Y to provide gates of a pair of PMOS transistors. The gate structures 720 connected to each other via gate vias 725 and lower interconnection patterns 740. The gates of the pair of PMOS transistors may be connected to each other and may be floated.

Referring to FIG. 20B, gates of a pair of PMOS transistors may be connected to a power supply line providing a second power supply voltage VSS, rather than being floated. For example, the sixth standard cell SC6 may further include a second power supply line M1(VSS) providing the second power supply voltage VSS between the first power supply lines M1(VDD) arranged at boundaries of the sixth standard cell SC6. The second power supply line M1(VSS) may be connected to gate structures 720 through a gate via 725 and/or lower interconnection patterns 740. Referring to FIG. 21B, a second power supply voltage VSS may be applied to gates of the PMOS transistors, unlike FIG. 21A.

FIGS. 22 to 24B illustrates example embodiments in which second power supply lines M1(VSS) supplying a second power supply voltage VSS are connected in a standard cell array, standard cells include NMOS transistors, and the NMOS transistors are connected to second power supply lines M1(VSS).

Figure 22:
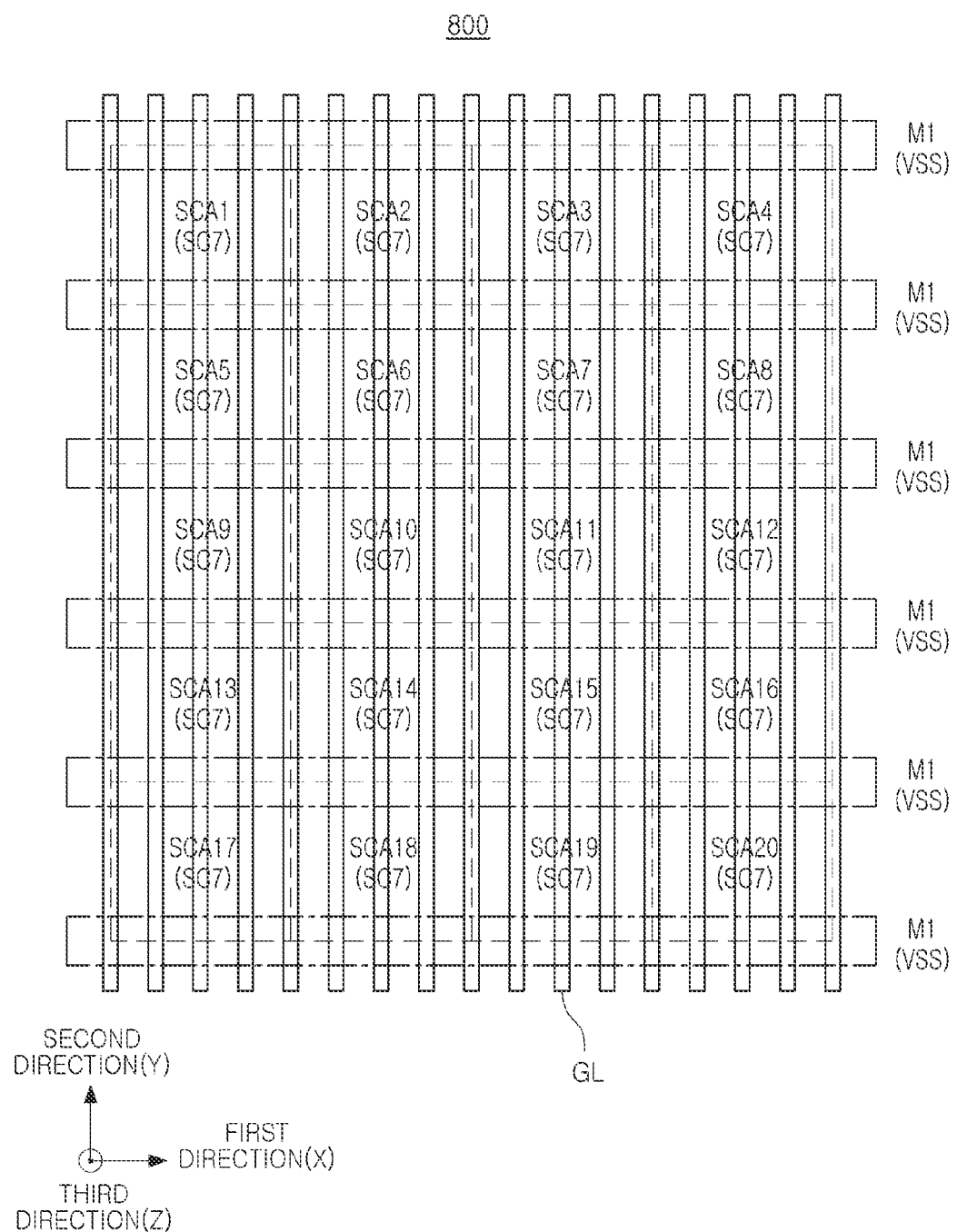
FIG. 22 is a plan view illustrating a lower capacitor according to some example embodiments.

FIG. 22 is a plan view illustrating a semiconductor device according to some example embodiments. For example, FIG. 22 is a plan view illustrating a standard cell array and a power supply line according to some example embodiments.

Referring to FIG. 22, standard cell regions SCA1 to SCA20, power supply lines, and gate patterns GL may be similar to those described with reference to FIGS. 4A and 4B. However, the standard cell regions SCA1 to SCA20 may include a seventh standard cell SC7, and the power supply lines may be second power supply lines M1(VSS) providing a second power supply voltage VSS. It is a matter of course that in a standard cell array, more various standard cells may be disposed in more standard cell regions.

According to some example embodiments, the standard cell array and the power supply lines M1(VSS) may provide a lower capacitor 800. The lower capacitor 800 may correspond to the lower capacitor 150 described with reference to FIGS. 2A and 2B. Seventh standard cells SC7 arranged in the standard cell regions SCA1 to SCA20 may provide a unit capacitor circuit. Each of the seventh standard cells SC7 may be connected to the capacitor structure 140 in parallel to supplement capacitance of a capacitor structure 140.

Figure 23A:
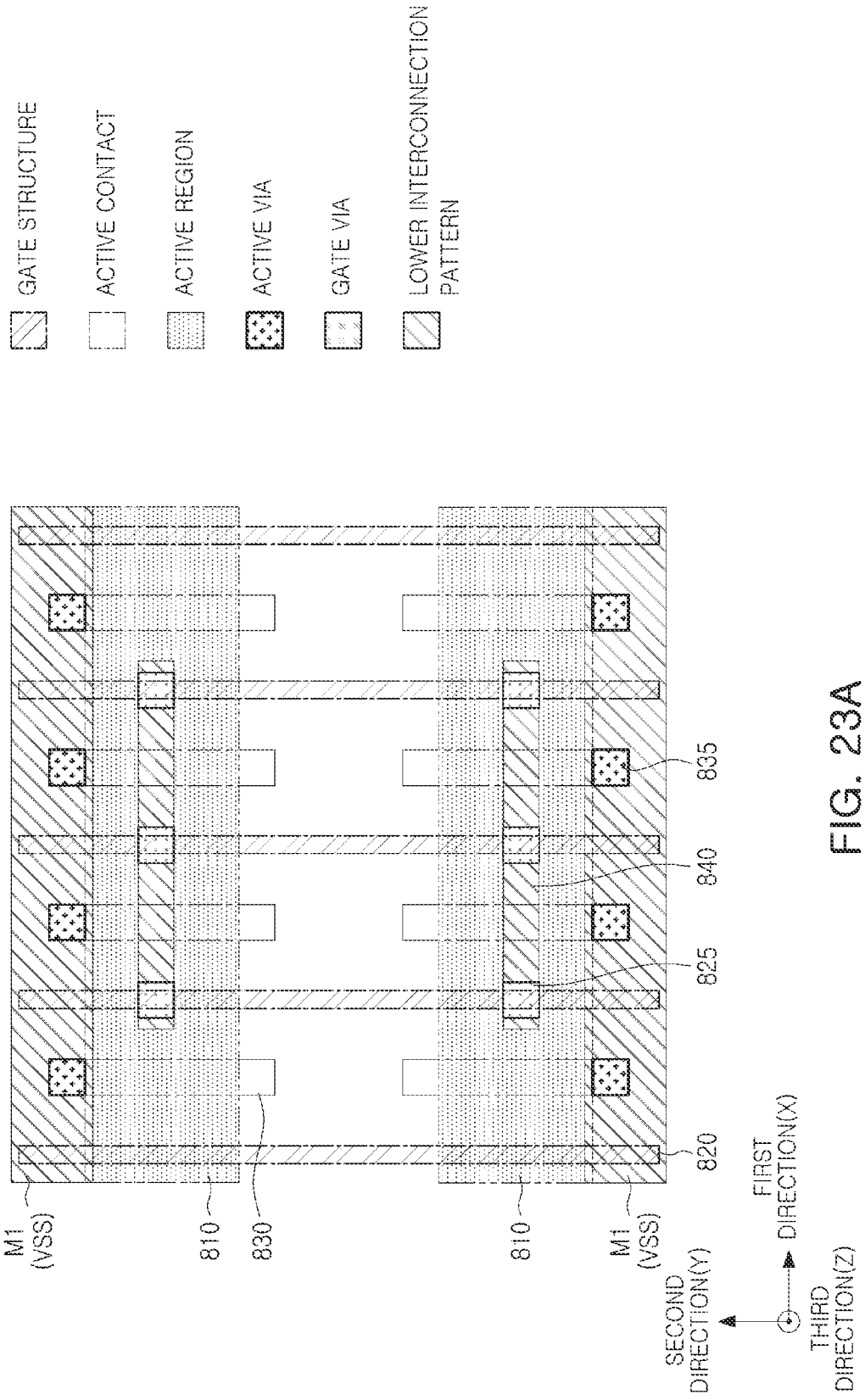
FIGS. 23A and 23B are plan views illustrating a seventh standard cell according to some example embodiments.
Figure 23B:
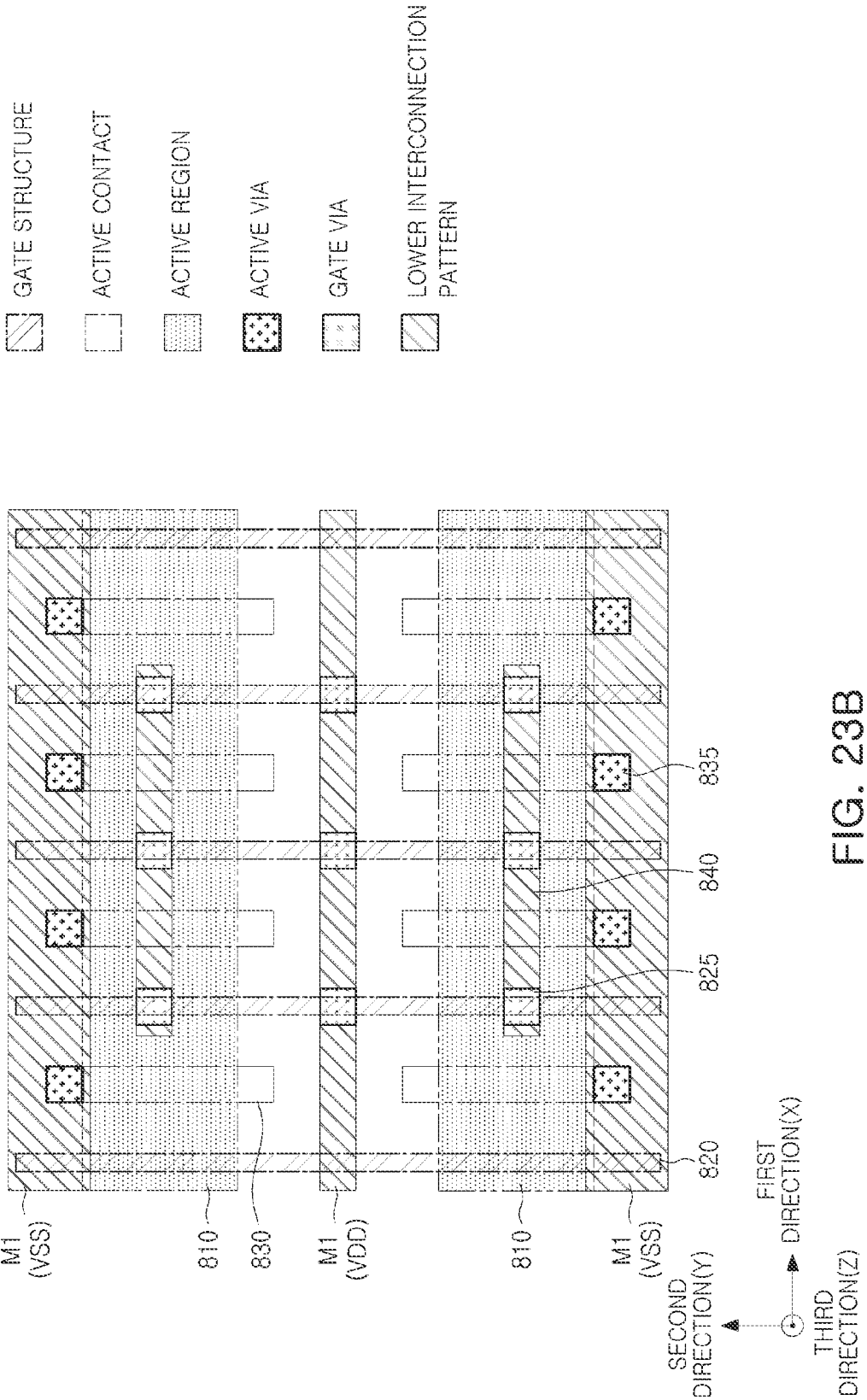
Figure 24A:
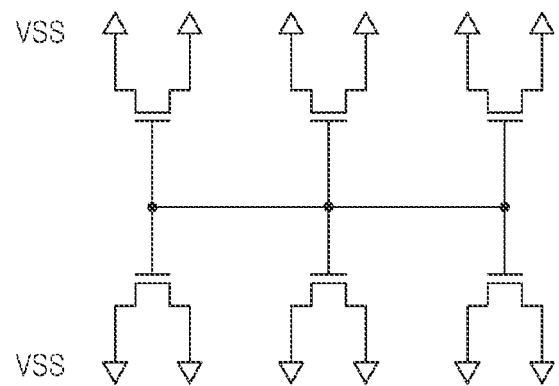
FIGS. 24A and 24B are circuit diagram illustrating a circuit corresponding to the seventh standard cell illustrated in FIGS. 23A and 23B.
Figure 24B:
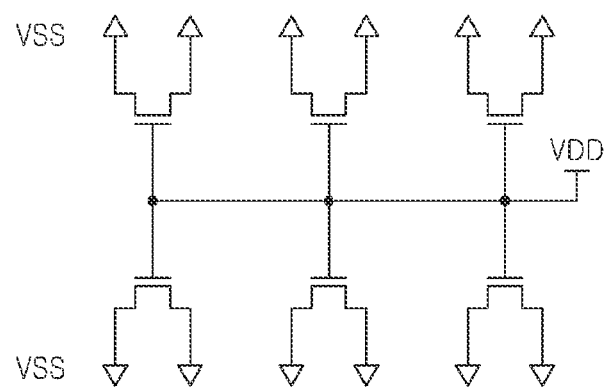

FIGS. 23A and 23B are plan views illustrating a seventh standard cell SC7 according to some example embodiments. FIG. 24A is a circuit diagram illustrating a circuit corresponding to the seventh standard cell SC7 according to the example embodiment illustrated in FIG. 23A, and FIG. 24B is a circuit diagram illustrating a circuit corresponding to the seventh standard cell SC7 according to the example embodiment illustrated in FIG. 23B.

Referring to FIG. 23A, active regions 810, gate structures 820, gate via 825, active contacts 830, active via 835, and lower interconnection patterns 840 included in the seventh standard cell SC7 may have a connection structure, similar to a connection structure of the active regions 710, the gate structures 720, the gate via 725, the active contacts 730, the active via 735, and the lower interconnection patterns 740 described with reference to FIG. 20A. However, a second power supply lines M1(VSS), rather than a first power supply lines M1(VDD), may be arranged at boundaries of the seventh standard cell SC7, and the active regions 810 and the gate structures 820 may provide NMOS transistors, rather than PMOS transistors.

Referring to FIG. 24A, the seventh standard cell SC7 may include a plurality of NMOS transistors. A second power supply voltage VSS may be applied to active regions of the NMOS transistors. All of gates of NMOS transistors may be connected to each other. In the example of FIG. 24A, the connected gates of the NMOS transistors may be floated.

Referring to FIG. 23B, in the seventh standard cell SC7 gates of a pair of NMOS transistors may be connected to a power supply line providing the first power supply voltage VDD rather than being floated. For example, the seventh standard cell SC7 may further include a first power supply line M1(VDD) providing a first power supply voltage VDD between second power supply lines M1(VSS) arranged at boundaries thereof. The first power supply line M1(VDD) may be connected to the gate structures 820 through the gate via 825. Referring to FIG. 24B, the first power supply voltage VDD may be applied to gates of the NMOS transistors, unlike FIG. 24A.

Figure 25:
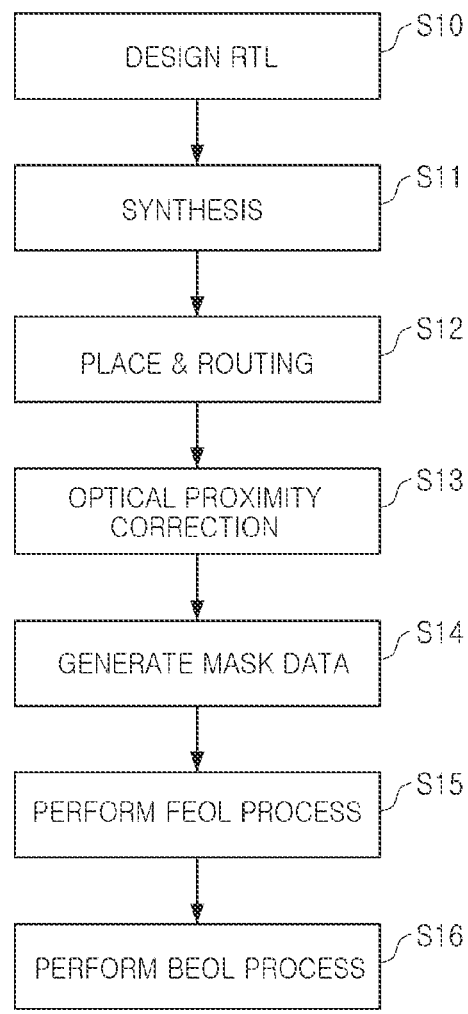
FIG. 25 is a flowchart illustrating a manufacturing method of a semiconductor device according to some example embodiments.

FIG. 25 is a flowchart illustrating a manufacturing method of a semiconductor device according to some example embodiments.

Referring to FIG. 25, the manufacturing method of a semiconductor device according to an example embodiment may start with operation S10 in which a register transfer level (RTL) is designed. An RTL code, generated by designing the RTL, may define a function of the semiconductor device. For example, the RTL code may be expressed in a language such as VHSIC hardware description language (VHDL), Verilog, or the like.

When the RTL code is generated, in operation S11, logic synthesis may be performed to generate net list data of the semiconductor device from the RTL code using standard cells stored in a predetermined library. The net list data may include standard cells and data defining a connection relationship between the standard cells, and may be generated by a predetermined semiconductor design tool. The standard cells may provide various circuits such as AND, OR, NOR, an inverter, an OR/AND inverter (OAI), an AND/OR inverter (AOI), a flip-flop, a latch, and the like.

According to some example embodiments, standard cells stored in the library may include a first transistor, connected to a first power supply line, and a second transistor, connected to a second power supply line, and may provide a unit capacitor having capacitance determined depending on a connection structure of active regions and gates of the first and second transistors. The standard cells may include those discussed above with respect to first to seventh standard cells SC1 to SC7.

After the logical synthesis is performed, in operation S12, a place-and-routing process may be performed to generate layout data based on the net list data. The place-and-routing process in operation S12 may be performed with reference to a layout of standard cells stored in the library. A semiconductor design tool for performing the place-and-routing process may generate layout data, including placement information of standard cells and routing information connecting the placed standard cells, based on the library in which standard cells are stored and the net list data. In the place-and-routing process, standard cells may be arranged in standard cell regions, and empty spaces between the standard cell regions may be assigned as filler cell region to be filled with filler cells. In a routing process, interconnection patterns may be formed to connect semiconductor devices, included in the standard cells, to each other.

When the place-and-routing process is completed, in operation S13, optical proximity correction may be performed on the layout data generated in operation S12. When the optical proximity correction is completed, in operation S14, mask data for forming various patterns on a plurality of layers may be generated. In operation S15, after performing exposure on a photoresist using mask data and forming a mask, a FEOL process may be performed to form a standard cell array including a plurality of standard cells, each providing a unit capacitor circuit.

When the FEOL process is completed, in operation S16, a BEOL process is performed to form a capacitor structure connected to the standard cell array on the standard cell array and including electrode structures, respectively included in a plurality of dielectric layers, and vias connecting the electrode structures to each other. Each of the plurality of standard cells, included in the standard cell array, may be connected to the capacitor structure in parallel.

According to some example embodiments, a lower capacitor having capacitance sufficient to supplement capacitance of a capacitor structure may be formed below the capacitor structure even in a scaled-down semiconductor process. In addition, standard cells included in the lower capacitor may each be selected from various standard cells provided from the standard cell library. Accordingly, lower capacitors having various levels of capacitance and leakage currents may be formed.

As described above, some example embodiments may provide a semiconductor device including a standard cell array including standard cells, each having capacitance, and a capacitor structure formed on the standard cell array.

According to some example embodiment, even when sizes of individual transistors which may be formed on a substrate may be decreased as semiconductor processes tend to be scaled down, a standard cell array including a plurality of standard cells may be configured below a capacitor structure to supplement capacitance of the capacitor structure. In addition, various standard cells having different levels of capacitance may be selectively configured to form a standard cell array having various levels of capacitance.

While some example embodiments have been shown and described above, it will be apparent to those skilled in the art that modifications and variations could be made without departing from the scope of the present inventive concepts as defined by the appended claims.

What is claimed is:
1. A semiconductor device comprising:
a standard cell array including a first plurality of standard cells and a second plurality of standard cells;
a plurality of power supply lines configured to provide a power supply voltage and extending in a first direction;
a capacitor structure including electrode structures included in each of a plurality of dielectric layers formed on the standard cell array, and the capacitor structure further having vias connecting the electrode structures; and
contacts electrically connecting the capacitor structure and the standard cell array to each other, wherein:
each of the first plurality of standard cells includes a first transistor connected to a first power supply line of the plurality of power supply lines, and a second transistor connected to a second power supply line of the plurality of power supply lines, and each of the first plurality of standard cells configured to provide a unit capacitor circuit having a capacitance that is based on a connection structure of (i) active regions of the first and second transistors thereof and the first and second power supply lines and (ii) gates of the first and second transistors thereof and the first and second power supply lines,
for each of the first plurality of standard cells, the first power supply line is configured to provide a first power supply voltage and is connected to a first active region of the first transistor thereof, the second power supply line is configured to provide a second power supply voltage that is connected to a first active region of the second transistor thereof, the connection structure of the gates of the first and second transistors and the first and second power supply lines of a first set of the first plurality of standard cells is different from the connection structure of the gates of the first and second transistors and the first and second power supply lines of a second set of the first plurality of standard cells, a first voltage level of the gates of the first transistors of the first set of the first plurality of standard cell and a second voltage level of the gates of the first transistors of the second set of the first plurality of standard cells are different each other, the second plurality of standard cells has a different connection structure from the first plurality of standard cells and includes a fourth standard cell, a third transistor of the fourth standard cell is connected to a third power supply line of the plurality of power supply lines, and a fourth transistor of the fourth standard cell is connected to the third power supply line and includes impurities having a conductivity type that is different from a conductivity type of the third transistor of the fourth standard cell, and in the fourth standard cell, the third power supply line is configured to provide the first power supply voltage and is connected to the active regions and gates of the third and fourth transistors.

2. The semiconductor device of claim 1, wherein the first set of the first plurality of standard cells includes a first standard cell, and wherein:
the second power supply voltage is lower than the first power supply voltage, the gate of the first transistor of the first standard cell is connected to the second power supply line, and the gate of the second transistor of the first standard cell is connected to the first power supply line.

3. The semiconductor device of claim 1, wherein the first set of the first plurality of standard cells includes a second standard cell, and wherein:
the second power supply voltage is lower than the first power supply voltage, and the gates of the first and second transistors of the second standard cell are connected to each other.

4. The semiconductor device of claim 3, wherein:
the gates of the first and second transistors of the second standard cell are floated.

5. The semiconductor device of claim 1, wherein:
the first set of the first plurality of standard cells includes a third standard cell in which the first power supply line is configured to provide the first power supply voltage and is connected to a drain region of the first transistor of the third standard cell, the second power supply line is configured to provide the second power supply voltage that is lower than the first power supply voltage and is connected to a source region of the second transistor of the third standard cell, the gate of the first transistor of the third standard cell is connected to a drain region of the second transistor of the third standard cell through an interconnection pattern, and a source region of the first transistor of the third standard cell is connected to the gate of the second transistor of the third standard cell.

6. The semiconductor device of claim 1, wherein:
the fourth standard cell includes a gate structure that provides the gate of the third transistor and the gate of the fourth transistor; and
the gate structure extends in a second direction that intersects the first direction.

7. The semiconductor device of claim 1, wherein the first set of the first plurality of standard cells includes a fifth standard cell, and wherein:
the second power supply voltage is higher than the first power supply voltage, and the second power supply line is connected to the active region of the second transistor of the fifth standard cell; and
the fifth standard cell comprises:
a third power supply line configured to provide the second power supply voltage to the gate of the first transistor of the fifth standard cell; and
a fourth power supply line configured to provide the first power supply voltage to the gate of the second transistor of the fifth standard cell.

8. The semiconductor device of claim 7, wherein:
in the fifth standard cell, the first transistor is a NMOS transistor and the second transistor is a PMOS transistor.

9. The semiconductor device of claim 1, wherein the first set of the first plurality of standard cells includes a sixth standard cell, and wherein:
the gates of the first and second transistors of the sixth standard cell are connected to each other, and the first and second transistors include impurities having the same conductivity type.

10. The semiconductor device of claim 9, wherein:
the gates of the first and second transistors of the sixth standard cell are floated.

11. The semiconductor device of claim 9, further comprising:
a third power supply line connected to the gates of the first and second transistors of the sixth standard cell and configured to provide the second power supply voltage that is lower than the first power supply voltage.

12. The semiconductor device of claim 9, further comprising:
a third power supply line connected to the gates of the first and second transistors of the sixth standard cell and configured to provide the second power supply voltage that is higher than the first power supply voltage.

13. The semiconductor device of claim 1, wherein:
the electrode structures included in the capacitor structure include electrode structures having opposite polarities; and
at least portions of the electrode structures having opposite polarities vertically overlap.

14. A semiconductor device comprising:
a standard cell array including a plurality of standard cells;
a plurality of power supply lines configured to provide a power supply voltage and extending in a first direction;
a capacitor structure including electrode structures included in each of a plurality of dielectric layers formed on the standard cell array and vias connecting the electrode structures to each other; and
contacts electrically connecting the capacitor structure and the standard cell array to each other, wherein:
each of the plurality of standard cells includes a first transistor and a second transistor including impurities having different conductivity types; and active regions and gates of the first and second transistors are connected to a first power supply line of the plurality of power supply lines.

15. A semiconductor device comprising:
a standard cell array including a plurality of standard cells;
a plurality of power supply lines configured to provide a power supply voltage and extending in a first direction; and
a capacitor structure including electrode structures included in each of a plurality of dielectric layers formed on the standard cell array and vias connecting the electrode structures to each other, wherein:
each of the plurality of standard cells is connected to the capacitor structure in parallel and configured to provide a unit capacitor circuit,
a first standard cell of the plurality of standard cells has a first capacitance and includes a first transistor and a second transistor that are connected to at least one of the plurality of power supply lines,
a second standard cell of the plurality of standard cells has a second capacitance that is different from the first capacitance and includes a first transistor and a second transistor having different conductivity types, wherein active regions and gates of the first and second transistors of the second standard cell are connected to a first power supply line of the plurality of power supply lines.

16. The semiconductor device of claim 15, wherein:
the first transistor of the first standard cell is connected to the first power supply line of the plurality of power supply lines, and the second transistor of the first standard cell is connected to a second power supply line of the plurality of power supply lines.

17. The semiconductor device of claim 16, wherein the plurality of standard cells are arranged in the first direction and in a second direction that intersects the first direction, and wherein the plurality of power supply lines are arranged at boundaries between the standard cells in the second direction.

* * * * *